(12) United States Patent
Choi et al.

(10) Patent No.: US 11,545,190 B2
(45) Date of Patent: Jan. 3, 2023

(54) SEMICONDUCTOR MEMORY DEVICE

(71) Applicant: SK hynix Inc., Icheon-si (KR)

(72) Inventors: Jung Dal Choi, Hwaseong-si (KR); Jung Shik Jang, Icheon-si (KR); Jin Kook Kim, Seongnam-si (KR); Dong Sun Sheen, Seongnam-si (KR); Se Young Oh, Seoul (KR); Ki Hong Lee, Suwon-si (KR); Dong Hun Lee, Icheon-si (KR); Sung Hoon Lee, Icheon-si (KR); Sung Yong Chung, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 29 days.

(21) Appl. No.: 16/683,027

(22) Filed: Nov. 13, 2019

(65) Prior Publication Data
US 2021/0020203 A1    Jan. 21, 2021

(30) Foreign Application Priority Data

Jul. 19, 2019    (KR) .......................... 10-2019-0087832

(51) Int. Cl.
| H01L 27/11568 | (2017.01) |
| G11C 5/06 | (2006.01) |
| H01L 27/1157 | (2017.01) |
| H01L 27/11582 | (2017.01) |

(52) U.S. Cl.
CPC .......... *G11C 5/063* (2013.01); *H01L 27/1157* (2013.01); *H01L 27/11568* (2013.01); *H01L 27/11582* (2013.01)

(58) Field of Classification Search
CPC ................. G11C 5/063; H01L 27/1157; H01L 27/11568
See application file for complete search history.

(56) References Cited

U.S. PATENT DOCUMENTS

| 7,906,818 | B2 | 3/2011 | Pekny | |
| 9,397,110 | B2 | 7/2016 | Lue | |
| 9,589,660 | B1* | 3/2017 | Hashimoto | ....... H01L 27/11582 |
| 9,916,901 | B1* | 3/2018 | Saito | .................. G11C 16/0483 |
| 10,566,348 | B1* | 2/2020 | Yeh | ................. H01L 21/823475 |
| 2016/0260725 | A1 | 9/2016 | Jung | |
| 2017/0062456 | A1* | 3/2017 | Sugino | ................ H01L 27/1157 |

(Continued)

FOREIGN PATENT DOCUMENTS

KR       1020150108179 A       9/2015

*Primary Examiner* — Sarah K Salerno
(74) *Attorney, Agent, or Firm* — William Park & Associates Ltd.

(57) ABSTRACT

The present technology includes a semiconductor memory device. The semiconductor memory device includes a first channel pattern and a second channel pattern each extending in a vertical direction and facing each other, a channel separation pattern formed between the first channel pattern and the second channel pattern and extending in the vertical direction, a stack including conductive patterns each surrounding the first channel pattern, the second channel pattern, and the channel separation pattern and stacked apart from each other in the vertical direction, a first memory pattern disposed between each of the conductive patterns and the first channel pattern, and a second memory pattern disposed between each of the conductive patterns and the second channel pattern.

19 Claims, 31 Drawing Sheets

(56) References Cited

U.S. PATENT DOCUMENTS

| | | | |
|---|---|---|---|
| 2018/0019257 A1* | 1/2018 | Son | H01L 27/11565 |
| 2018/0182776 A1* | 6/2018 | Kim | H01L 29/40117 |
| 2018/0374868 A1* | 12/2018 | Choi | H01L 27/11582 |
| 2019/0305095 A1* | 10/2019 | Choi | H01L 27/11565 |
| 2020/0006375 A1* | 1/2020 | Zhou | H01L 27/11578 |
| 2020/0098774 A1* | 3/2020 | Yeh | H01L 27/11582 |

* cited by examiner

SEMICONDUCTOR MEMORY DEVICE

CROSS-REFERENCE TO RELATED APPLICATION

The present application claims priority under 35 U.S.C. § 119(a) to Korean patent application number 10-2019-0087832, filed on Jul. 19, 2019, in the Korean Intellectual Property Office, the entire disclosure of which is incorporated herein by reference.

BACKGROUND

1. Technical Field

The present disclosure relates to a semiconductor memory device, and more particularly to a three-dimensional semiconductor memory device.

2. Related Art

Semiconductor memory devices may include a plurality of memory cells capable of storing data. In order to improve a degree of integration of semiconductor memory devices, three-dimensional memory devices in which memory cells are arranged in three-dimensions on a substrate have been proposed.

SUMMARY

A semiconductor memory device according to an embodiment of the present disclosure may include a first channel pattern and a second channel pattern each extending in a vertical direction and facing each other, a channel separation pattern formed between the first channel pattern and the second channel pattern and extending in the vertical direction, a stack including conductive patterns each surrounding the first channel pattern, the second channel pattern, and the channel separation pattern and stacked apart from each other in the vertical direction, a first memory pattern disposed between each of the conductive patterns and the first channel pattern, and a second memory pattern disposed between each of the conductive patterns and the second channel pattern.

A semiconductor memory device according to an embodiment of the present disclosure may include a cell gate electrode extending in a first direction and a second direction not parallel to the first direction, a hole passing through the cell gate electrode, a first channel pattern formed on one sidewall of the hole, a second channel pattern formed on the other sidewall of the hole and spaced apart from the first channel pattern, a first memory pattern disposed between the cell gate electrode and the first channel pattern, and second memory patterns disposed between the cell gate electrode and the second channel pattern.

As an embodiment, the semiconductor memory device may further include a first bit line connected to one end of the first channel pattern, and a second bit line connected to one end of the second channel pattern and spaced apart from the first bit line.

As an embodiment, the semiconductor memory device may further include a bit line commonly connected to one end of the first channel pattern and one end of the second channel pattern, a first select gate electrode disposed between the cell gate electrode and the bit line, a second select gate electrode disposed between the cell gate electrode and the bit line and parallel to the first select gate electrode, and an upper separation structure disposed between the first select gate electrode and the second select gate electrode and overlapping the cell gate electrode. The first channel pattern may extend to pass through the first select gate electrode, and the second channel pattern may extend to pass through the second select gate electrode.

As an embodiment, the semiconductor memory device may further include a bit line commonly connected to one end of the first channel pattern and one end of the second channel pattern, a lower select gate electrode disposed between the cell gate electrode and the bit line, and an upper select gate electrode disposed between the lower select gate electrode and the bit line. The first and second channel patterns may extend to pass through the lower select gate electrode and the upper select gate electrode, respectively. The first channel pattern may include a first channel region facing the lower select gate electrode and a second channel region facing the upper select gate electrode. The second channel pattern may include a third channel region facing the lower select gate electrode and a fourth channel region facing the upper select gate electrode. Threshold voltages of each of the first channel region and the fourth channel region may be higher than threshold voltages of each of the second channel region and the third channel region.

DETAILED DESCRIPTION

The specific structural or functional descriptions disclosed herein are merely illustrative for the purpose of describing embodiments according to the concept of the present disclosure. The embodiments according to the concept of the present disclosure can be implemented in various forms, and should not be construed as limited to the embodiments set forth herein.

Embodiments of the present disclosure provide a semiconductor memory device capable of improving a degree of integration of memory cells.

Figure 1:
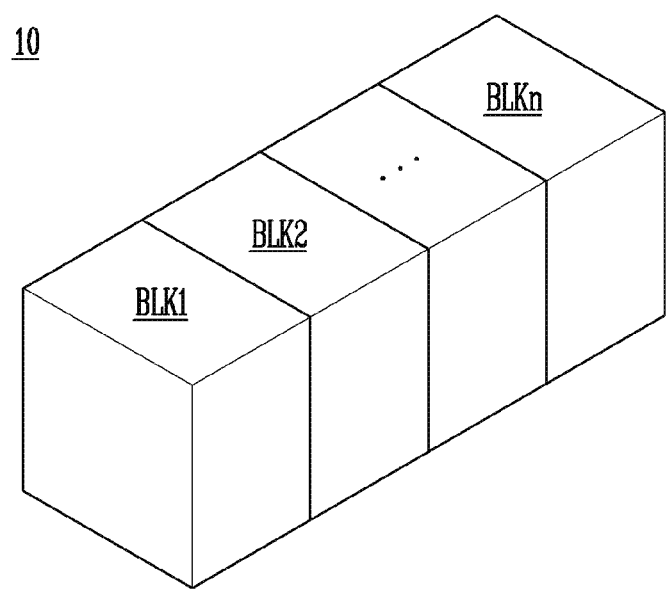
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 may include a plurality of memory blocks BLK1 to BLKn.

Each of the memory blocks BLK1 to BLKn includes a source line, bit lines, memory cell strings electrically connected to the source line and the bit lines, word lines electrically connected to the memory cell strings, and select lines electrically connected to the memory cell strings. Each of the memory cell strings may include memory cells and select transistors connected in series by a channel pattern. The select lines and the word lines may be used as gate electrodes of the select transistors and the memory cells.

Figure 2A:
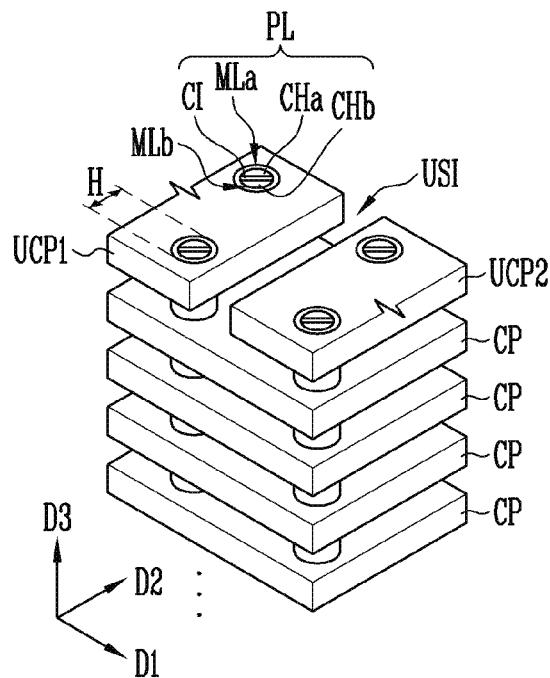
FIGS. 2A and 2B are diagrams illustrating various embodiments of gate electrodes configuring each memory block shown in FIG. 1.
Figure 2B:
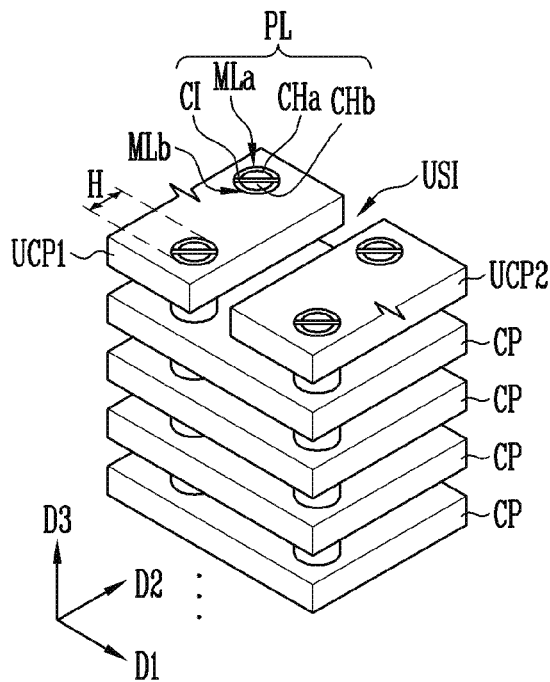

FIGS. 2A and 2B are diagrams illustrating various embodiments of gate electrodes configuring each memory block shown in FIG. 1.

Referring to FIGS. 2A and 2B, each of the memory blocks BLK1 to BLKn shown in FIG. 1 may include gate electrodes CP, UCP1, and UCP2 stacked apart from each other in a vertical direction D3. Each of the gate electrodes CP, UCP1, and UCP2 may extend in a first direction D1 and a second direction D2 that cross each other in a plane perpendicular to the vertical direction D3. Here, any one direction of D1, D2, and D3 is not parallel to the remaining two. As used herein, a first direction not parallel to a second direction means that the first direction and the second direction are not the same direction. For some embodiments, a first direction not parallel to a second direction means that the first and second directions are substantially perpendicular.

The gate electrodes may include a plurality of conductive patterns CP and one or more upper conductive patterns UCP1 and UCP2 stacked on the plurality of conductive patterns CP. For example, a first upper conductive pattern UCP1 and a second upper conductive pattern UCP2 separated from each other by an upper separation structure USI may overlap the plurality of conductive patterns CP.

The first upper conductive pattern UCP1 and the second upper conductive pattern UCP2 may be spaced apart from the plurality of conductive patterns CP in the vertical direction D3. The upper separation structure USI disposed between the first upper conductive pattern UCP1 and the second upper conductive pattern UCP2 may overlap the plurality of conductive patterns CP. Each of FIGS. 2A and 2B illustrates a case where the first upper conductive pattern UCP1 and the second upper conductive pattern UCP2 are disposed in a single layer, but the present disclosure is not limited thereto. For example, two or more first upper conductive patterns may be stacked on the plurality of conductive patterns CP apart in the vertical direction D3, and two or more second upper portions may be stacked on the plurality of conductive patterns CP apart in the vertical direction D3. The first upper conductive pattern UCP1 and the second upper conductive pattern UCP2 may configure the select lines used as the select gate electrodes. For example, each of the first upper conductive pattern UCP1 and the second upper conductive pattern UCP2 may configure a drain select line used as a drain select gate electrode.

The conductive patterns CP may include the word lines used as the cell gate electrodes. The conductive patterns CP may include dummy word lines used as dummy gate electrodes. The conductive patterns CP may include a source select line used as a source select gate electrode.

Each of the gate electrodes CP, UCP1, and UCP2 may be penetrated by a hole H. In different embodiments, the hole H may have a cross-section of various shapes, such as a circle, an ellipse, a square, and a polygon. The hole H may be filled with a cell plug PL. The cell plug PL may include a first channel pattern CHa, a second channel pattern CHb, a channel separation pattern CI, a first memory pattern MLa, and a second memory pattern MLb.

The first channel pattern CHa and the second channel pattern CHb may face each other and may be spaced apart from each other by the channel separation pattern CI. The first channel pattern CHa may be formed on one sidewall of the hole H, and the second channel pattern CHb may be formed on the other sidewall of the hole H. The first channel pattern CHa, the second channel pattern CHb, and the channel separation pattern CI may extend in the vertical direction D3. The channel separation pattern CI may be surrounded by the gate electrodes CP, UCP1, and UCP2.

The first memory pattern MLa may be disposed between each of the gate electrodes CP, UCP1, and UCP2 and the first channel pattern CHa, and the second memory pattern MLb may be disposed between each of the gate electrodes CP, UCP1, UCP2 and the second channel patterns CHb. As an embodiment, the first memory pattern MLa and the second memory pattern MLb may extend on a sidewall of the channel separation pattern CI and may be connected to each other as shown in FIG. 2A. As another embodiment, the first memory pattern MLa and the second memory pattern MLb may be separated from each other by the channel separation pattern CI as shown in FIG. 2B. In other words, the channel separation pattern CI may extend between the first memory pattern MLa and the second memory pattern MLb.

Figure 3A:
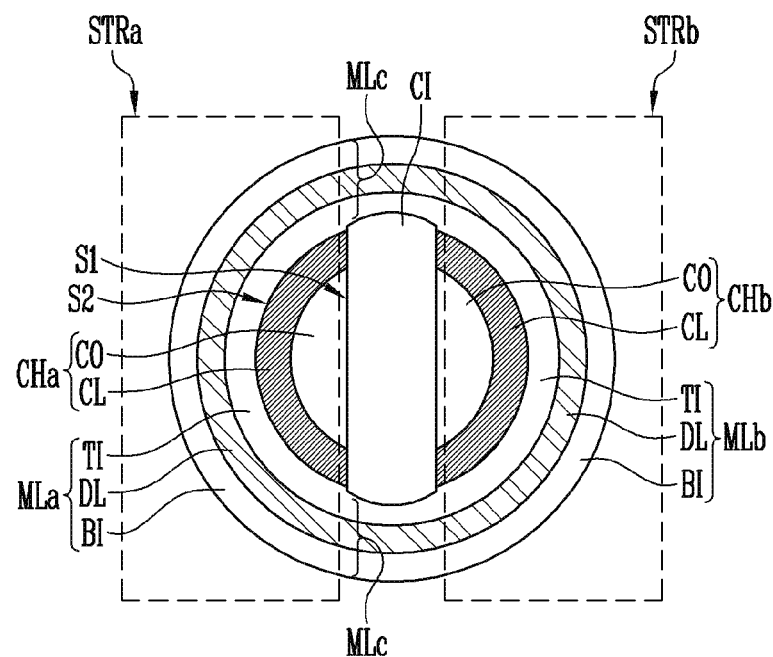
FIGS. 3A and 3B are plan views illustrating a first memory cell string and a second memory cell string defined by each of the cell plugs shown in FIGS. 2A and 2B.
Figure 3B:
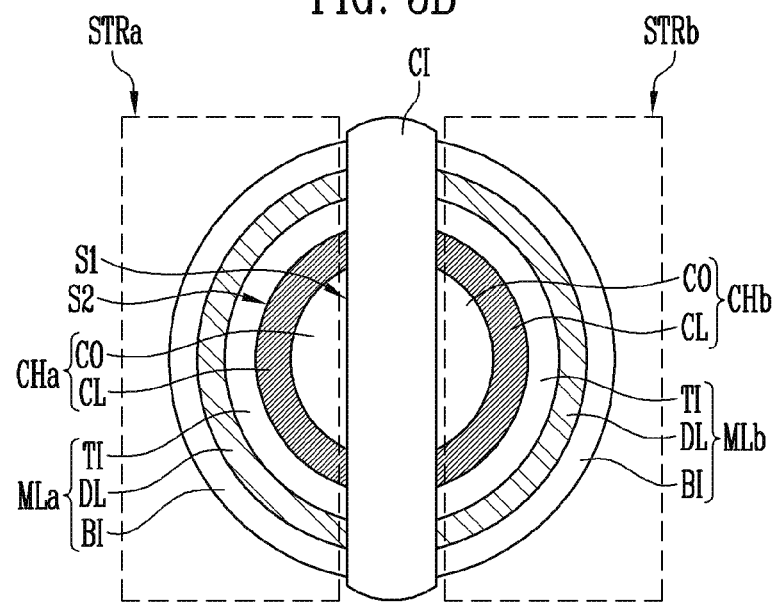

FIGS. 3A and 3B are plan views illustrating a first memory cell string STRa and a second memory cell string STRb defined by each of the cell plugs PL shown in FIGS. 2A and 2B.

Referring to FIGS. 3A and 3B, the first memory cell string STRa and the second memory cell string STRb may be separated from each other by the channel separation pattern CI of the cell plug PL corresponding thereto. The first memory cell string STRa may include memory cells and select transistors connected in series by the first channel pattern CHa, and the second memory cell string STRb may include memory cells and select transistors connected in series by the second channel pattern CHb. The channel separation pattern CI may be formed of an insulating material.

Each of the first channel pattern CHa and the second channel pattern CHb may include a first sidewall S1 and a second sidewall S2. The first sidewall S1 faces a center region of the hole H described above with reference to FIGS. 2A and 2B, and the second sidewall S2 faces a sidewall of the hole H described above with reference to FIGS. 2A and 2B. In other words, the second sidewall S2 faces each of the gate electrodes CP, UCP1, and UCP2 described above with reference to FIGS. 2A and 2B. The first sidewall S1 may be coplanar with the channel separation pattern CI. The second sidewall S2 may have a curvature greater than a curvature of the first sidewall S1. For example, the first sidewall S1 may be formed to be substantially flat.

Each of the first channel pattern CHa and the second channel pattern CHb may include a core insulating film CO and a channel film CL. The core insulating film CO may have one sidewall coplanar with the sidewall of the channel separation pattern CI and the other sidewall surrounded by the channel film CL. The channel film CL may include a semiconductor material that may be used as a channel region.

Each of the first memory pattern MLa and the second memory pattern MLb may include a tunnel insulating film TI formed on a sidewall of the channel film CL, a data storage film DL formed on a sidewall of the tunnel insulating film TI, and a blocking insulating film BI formed on a sidewall of the data storage film DL. The data storage film DL may be formed of a material film capable of storing data that is changed using fowler-nordheim tunneling. To this end, the data storage film DL may be formed of various materials, for example, a charge trap film. The charge trap film may include a nitride film. The present disclosure is not limited thereto, and the data storage film DL may include a phase change material, a nano dot, or the like. The blocking insulating film BI may include an oxide film capable of blocking charge. The tunnel insulating film TI may be formed of a silicon oxide film capable of charge tunneling.

As an embodiment, at least one of the tunnel insulating film TI, the data storage film DL, and the blocking insulating film BI may extend on the sidewall of the channel separation pattern CI. For example, as shown in FIG. 3A, the tunnel insulating film TI, the data storage film DL, or the blocking insulating film BI may extend on the sidewall of the channel separation pattern CI to configure a memory pattern extension portion MLc. The first memory pattern MLa and the second memory pattern MLb may be connected to each other by the memory pattern extension portion MLc.

As another embodiment, as shown in FIG. 3B, each of the tunnel insulating film TI, the data storage film DL, and the blocking insulating film BI may be separated into the first memory pattern MLa and the second memory pattern MLb by the channel separation pattern CI.

Figure 4:
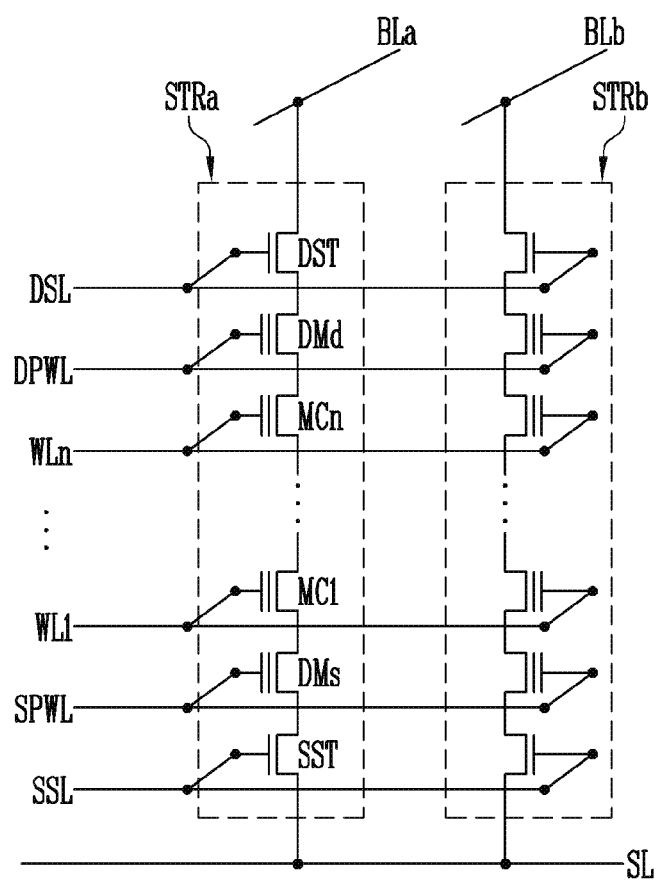
FIG. 4 is a circuit diagram illustrating a first memory cell string and a second memory cell string according to an embodiment of the present disclosure.

FIG. 4 is a circuit diagram illustrating a first memory cell string STRa and a second memory cell string STRb according to an embodiment of the present disclosure.

Referring to FIG. 4, the first memory cell string STRa and the second memory cell string STRb may be connected to a source line SL. The first memory cell string STRa may be connected to a first bit line BLa. The second memory cell string STRb may be connected to a second bit line BLb spaced apart from the first bit line BLa.

Each of the first memory cell string STRa and the second memory cell string STRb may include at least one source select transistor SST connected to the source line SL, at least one drain select transistor DST connected to a bit line BLa or BLb corresponding thereto, and a plurality of memory cells MC1 to MCn connected in series between the drain select transistor DST and the source select transistor SST. Each of the first memory cell string STRa and the second memory cell string STRb may further include at least one source side dummy cell DMs connected between the plurality of memory cells MC1 to MCn and the source select transistor SST. Each of the first memory cell string STRa and the second memory cell string STRb may further include at least one drain side dummy cell DMd connected between the plurality of memory cells MC1 to MCn and the drain select transistor DST. At least one of the source side dummy cell DMs or the drain side dummy cell DMd may be omitted.

The first memory cell string STRa and the second memory cell string STRb may be commonly connected to a source select line SSL used as a source select gate electrode of the source select transistor SST. The first memory cell string STRa and the second memory cell string STRb may be commonly connected to a source side dummy word line SPWL used as a gate electrode of the source side dummy cell DMs. The first memory cell string STRa and the second memory cell string STRb may be commonly connected to each of the word lines WL1 to WLn used as cell gate electrodes of the memory cells MC1 to MCn. The first memory cell string STRa and the second memory cell string STRb may be commonly connected to a drain side dummy word line DPWL used as a gate electrode of the drain side dummy cell DMd. The first memory cell string STRa and the second memory cell string STRb may be commonly connected to a drain select line DSL used as a drain select gate electrode of the drain select transistor DST.

The first memory cell string STRa and the second memory cell string STRb are connected to the first bit line BLa and the second bit line BLb different from each other respectively. Therefore, by individually controlling signals applied to the first bit line BLa and the second bit line BLb, one of the first memory cell string STRa and the second memory cell string STRb may be selected.

Figure 5:
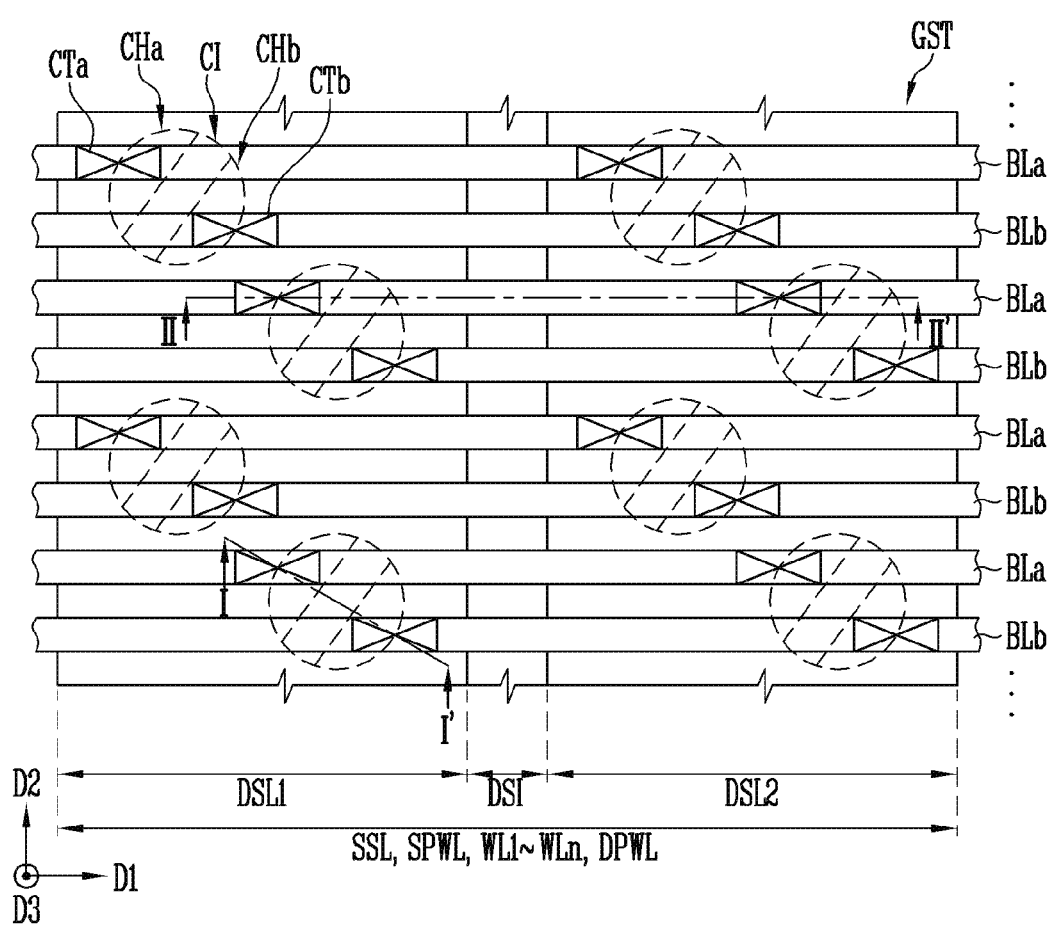
FIG. 5 is a plan view illustrating a semiconductor memory device according to an embodiment of the present disclosure.

FIG. 5 is a plan view illustrating a semiconductor memory device according to an embodiment of the present disclosure. FIG. 5 illustrates an embodiment of the bit lines BLa and BLb and a gate stack GST that may configure the circuit shown in FIG. 4.

Referring to FIG. 5, the semiconductor memory device may include the gate stack GST and the plurality of bit lines BLa and BLb overlapping the gate stack GST. The gate stack GST may include a plurality of conductive patterns SSL, SPWL, WL1 to WLn, and DPWL, and at least one pair of first upper conductive pattern DSL1 and a second upper conductive pattern DSL2.

Each of the conductive patterns SSL, SPWL, WL1 to WLn, and DPWL, the first upper conductive pattern DSL1, and the second upper conductive pattern DSL2 may extend in the first direction D1 and the second direction D2 crossing each other. The bit lines BLa and BLb may extend in the first direction D1 and may be spaced apart from each other in the second direction D2.

The conductive patterns may include at least one source select line SSL and the plurality of word lines WL1 to WLn. The conductive patterns may further include at least one of the source side dummy word line SPWL or the drain side dummy word line DPWL.

The first upper conductive pattern DSL1 and the second upper conductive pattern DSL2 may be spaced apart from each other in the first direction D1 by an upper separation structure DSI extending in the second direction D2. Each of the first upper conductive pattern DSL1 and the second upper conductive pattern DSL2 may be used as the drain select line DSL described above with reference to FIG. 4. The upper separation structure DSI may overlap the source select line SSL, the plurality of word lines WL1 to WLn, the source side dummy word line SPWL, and the drain side dummy word line DPWL. Each of the first upper conductive pattern DSL1 and the second upper conductive pattern DSL2 may be shared by a pair of first channel pattern CHa and second channel pattern CHb corresponding thereto.

Each of the conductive patterns SSL, SPWL, WL1 to WLn, and DPWL, the first upper conductive pattern DSL1, and the second upper conductive pattern DSL2 may be penetrated by the first channel pattern CHa and the second channel pattern CHb which face each other with the channel separation pattern CI interposed therebetween. The first channel pattern CHa and the second channel pattern CHb may be surrounded by each of the conductive patterns SSL, SPWL, WL1 to WLn, and DPWL, and may be commonly controlled by each of the conductive patterns SSL, SPWL, WL1 to WLn, and DPWL. Each of the first channel pattern CHa and the second channel pattern CHb may include a first sidewall facing the sidewall of the channel separation pattern CI and a second sidewall facing the gate stack GST. The second sidewall may have a curvature greater than a curvature of the first sidewall.

The bit lines BLa and BLb may include a first bit line BLa connected to the first channel pattern CHa and a second bit line BLb connected to the second channel pattern CHb. The first bit line BLa may be connected to one end of the first channel pattern CHa via a first contact plug CTa. The second bit line BLb may be connected to one end of the second channel pattern CHb via a second contact plug CTb.

The channel separation pattern CI may extend in an oblique direction with respect to the first and second directions D1 and D2. In this case, the first contact plug CTa and the second contact plug CTb may be adjacent to each other in the oblique directions with respect to the first and second directions D1 and D2.

Figure 6A:
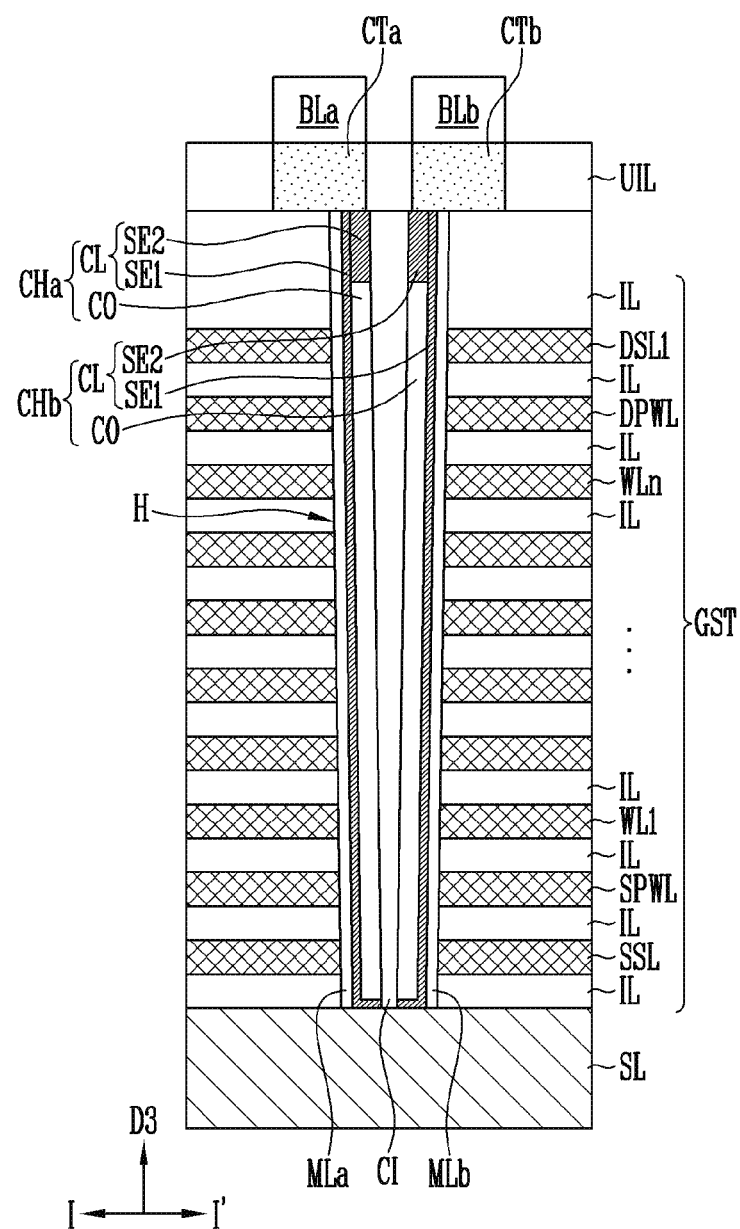
FIGS. 6A and 6B are cross-sectional views of the semiconductor memory device shown in FIG. 5.
Figure 6B:
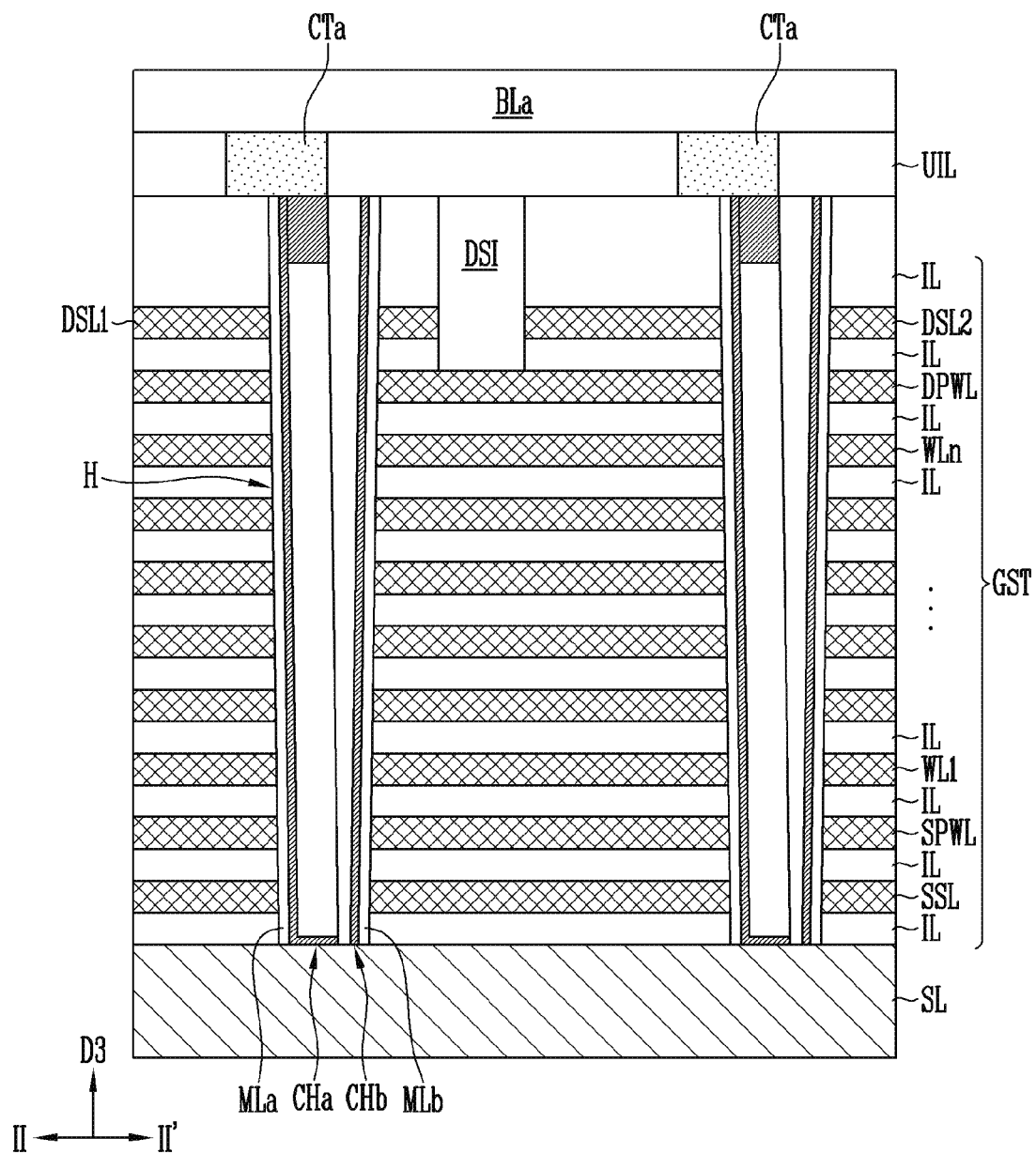

FIGS. 6A and 6B are cross-sectional views of the semiconductor memory device shown in FIG. 5. FIG. 6A illustrates a cross section of the semiconductor memory device taken along a line I-I' of FIG. 5, and FIG. 6B illustrates a cross section of the semiconductor memory device taken along a line II-II' of FIG. 5.

Referring to FIGS. 6A and 6B, the gate stack GST may be disposed between the source line SL and an upper insulating film UIL. The gate stack GST may include the conductive patterns SSL, SPWL, WL1 to WLn, and DPWL which are stacked apart from each other in the vertical direction D3, and the first upper conductive pattern DSL1 and the second upper conductive pattern DSL2. The first upper conductive pattern DSL1 and the second upper conductive pattern DSL2 are spaced apart from the conductive patterns SSL, SPWL, WL1 to WLn, and DPWL in the vertical direction D3 and separated from each other by the upper separation structure DSI. The gate stack GST may further include interlayer insulating films IL stacked apart from each other in the vertical direction D3. Each of the conductive patterns SSL, SPWL, WL1 to WLn, and DPWL, the first upper conductive pattern DSL1, and the second upper conductive pattern DSL2 may be disposed between the interlayer insulating films IL adjacent to each other in the vertical direction D3. In other words, the interlayer insulating films IL may be stacked alternately with the conductive patterns SSL, SPWL, WL1 to WLn, and DPWL, the first upper conductive pattern DSL1, and the second upper conductive pattern DSL2 in the vertical direction D3.

The gate stack GST may be penetrated by the hole H. The first channel pattern CHa may be disposed on one sidewall of the hole H as described above with reference to FIGS. 2A and 2B, and the second channel pattern CHb may be disposed on the other sidewall of the hole H as described above with reference to FIGS. 2A and 2B.

Each of the first channel pattern CHa and the second channel pattern CHb may include the core insulating film CO and the channel film CL as described above with reference to FIGS. 3A and 3B. The core insulating film CO may be formed to be lower than the channel separation pattern CI and the channel film CL. The channel film CL may include a first semiconductor film SE1 and a second semiconductor film SE2. The first semiconductor film SE1 may be formed on a sidewall of the core insulating film CO. The second semiconductor film SE2 may be formed between the first semiconductor film SE1 and the channel separation pattern CI, and may be disposed on the core insulating film CO. The first semiconductor film SE1 and the second semiconductor film SE2 may include silicon. The second semiconductor film SE2 may include a conductive type dopant. For example, the second semiconductor film SE2 may include an n-type dopant. The first semiconductor film SE1 may be connected to the source line SL.

The first memory pattern MLa may be formed on a sidewall of the first channel pattern CHa, and the second memory pattern MLb may be formed on a sidewall of the second channel pattern CHb. The first memory pattern MLa and the second memory pattern MLb may extend in the vertical direction D3. Each of the first memory pattern MLa and the second memory pattern MLb may include the tunnel insulating film TI, the data storage film DL, and the blocking insulating film BI, as described above with reference to FIGS. 3A and 3B.

The upper insulating film UIL may be penetrated by the first contact plug CTa and the second contact plug CTb. The first bit line BLa and the second bit line BLb shown in FIG. 5 may be disposed on the upper insulating film UIL and may be spaced apart from the gate stack GST by the upper insulating film UIL. The first contact plug CTa may extend from the first channel pattern CHa toward the first bit line BLa. The second contact plug CTb may extend from the second channel pattern CHb toward the second bit line BLb.

The upper separation structure DSI may be formed at a depth that does not pass through the conductive patterns SSL, SPWL, WL1 to WLn, and DPWL, and may overlap the conductive patterns SSL, SPWL, WL1 to WLn, and DPWL.

Figure 7:
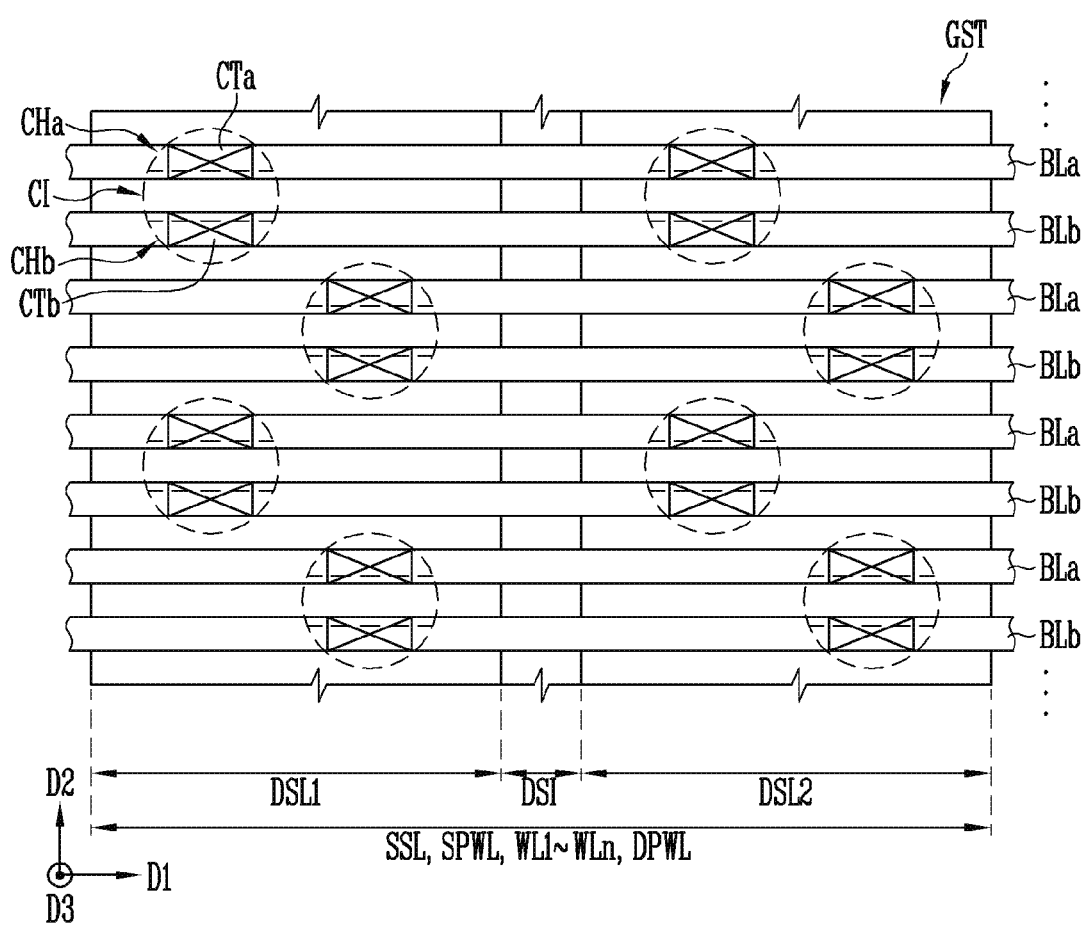
FIGS. 7 and 8 are plan views illustrating semiconductor memory devices according to embodiments of the present disclosure.
Figure 8:
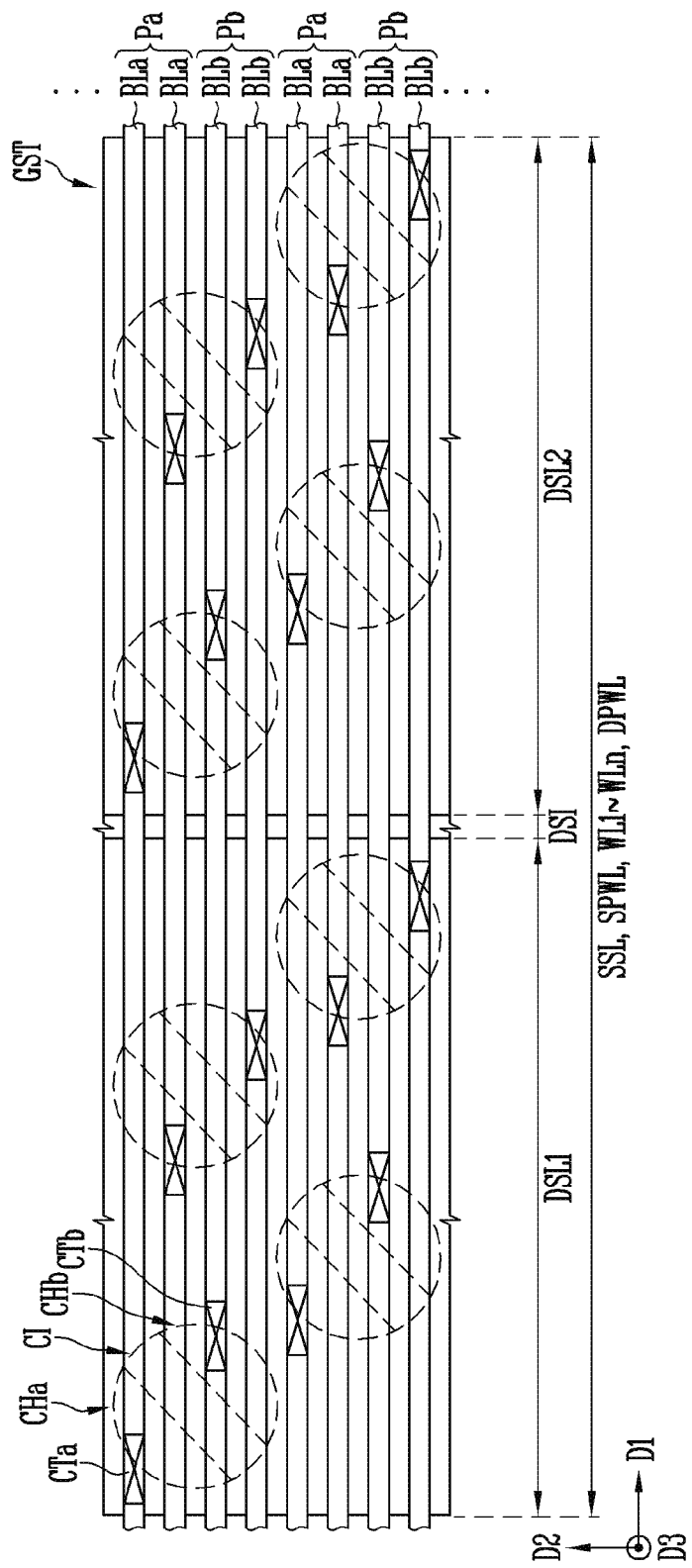

FIGS. 7 and 8 are plan views illustrating semiconductor memory devices according to embodiments of the present disclosure. FIGS. 7 and 8 illustrate various embodiments of the bit lines BLa and BLb and the gate stack GST that may configure the circuit shown in FIG. 4.

Referring to FIGS. 7 and 8, the semiconductor memory device may include the gate stack GST and the plurality of bit lines BLa and BLb overlapping the gate stack GST. The gate stack GST may include a plurality of conductive patterns SSL, SPWL, WL1 to WLn, and DPWL, and at least one pair of first upper conductive pattern DSL1 and second upper conductive pattern DSL2.

The conductive patterns SSL, SPWL, WL1 to WLn, and DPWL, the first upper conductive pattern DSL1, the second upper conductive pattern DSL2, and the bit lines BLa and BLb may be formed in the same layout as described above with reference to FIG. 5. As described above with reference to FIG. 5, the conductive patterns may include at least one source select line SSL, the plurality of word lines WL1 to WLn, the source side dummy word line SPWL, and the drain side dummy word line DPWL.

The conductive patterns SSL, SPWL, WL1 to WLn, and DPWL, the first upper conductive pattern DSL1, the second upper conductive pattern DSL2, and the bit lines BLa and BLb may be formed in the same stack structure as described above refer to FIGS. 6A and 6B.

As described above with reference to FIG. 5, the first upper conductive pattern DSL1 and the second upper conductive pattern DSL2 may be spaced apart from each other in the first direction D1 by the upper separation structure DSI extending in the second direction D2. Each of the first upper conductive pattern DSL1 and the second upper conductive pattern DSL2 may be used as the drain select line DSL described above with reference to FIG. 4.

Each of the conductive patterns SSL, SPWL, WL1 to WLn, and DPWL, the first upper conductive pattern DSL1, and the second upper conductive pattern DSL2 may be penetrated by the first channel pattern Cha and the second channel pattern CHb which face each other with the first channel pattern interposed therebetween. Each of the first channel pattern CHa and the second channel pattern CHb may include the core insulating film CO and the channel film CL as described above with reference to FIGS. 6A and 6B. Each of the first memory pattern MLa and the second memory pattern MLb described above with reference to FIG. 6A may be formed on the sidewalls of the first channel pattern CHa and the second channel pattern CHb.

As an embodiment, the channel separation pattern CI may be a bar type extending in the first direction D1 as shown in FIG. 7. In this case, the first contact plug CTa and the second contact plug CTb may be adjacent to each other in the second direction D2. A cross-sectional structure of the channel separation pattern CI shown in FIG. 7 along the first direction D1 is the same as the cross-sectional structure shown in FIG. 6A.

As another embodiment, the channel separation pattern CI may extend in the oblique direction with respect to the first and second directions D1 and D2 as shown in FIG. 8. In this case, the first contact plug CTa and the second contact plug CTb may be adjacent to each other in the oblique direction with respect to the first and second directions D1 and D2. A cross-sectional structure of the channel separation pattern CI shown in FIG. 8 along an extension direction of the channel separation pattern CI is the same as the cross-sectional structure shown in FIG. 6A.

Referring to FIGS. 7 and 8 again, the bit lines BLa and BLb may include first bit lines BLa and second bit lines BLb. Each of the first bit lines BLa may be connected to the first channel pattern CHa corresponding thereto via the first contact plug CTa. Each of the second bit lines BLb may be connected to one end of the second channel pattern CHb corresponding thereto via the second contact plug CTb.

As an embodiment, the first bit lines BLa and the second bit lines BLb may be alternately disposed in the second direction D2 as shown in FIG. 7. The pair of first bit lines BLa and second bit lines BLb may overlap each cell plug including the channel separation pattern CI, the first channel pattern CHa, and the second channel pattern CHb.

As another embodiment, three or more bit lines BLa and BLb may overlap each cell plug including the channel separation pattern CI, the first channel pattern CHa, and the second channel pattern CHb. In this case, a pair of first and second bit lines corresponding thereto may be connected to each cell plug, and at least one bit line may be disposed between the first bit line and the second bit line. The at least one bit line may be insulated from the first channel pattern CHa and the second channel pattern CHb configuring any cell plug overlapping therewith, and may be connected to the first channel pattern CHa and the second channel pattern CHb configuring another cell plug. For example, referring to FIG. 8, the first bit lines BLa may be divided into a plurality of pairs Pa, and the second bit lines BLb may be divided into a plurality of pairs Pb. The pairs Pa of the first bit lines and the pairs Pb of the second bit lines Pb may be alternately disposed in the second direction D2. Each cell plug including the channel separation pattern CI, the first channel pattern CHa, and the second channel pattern CHb may overlap a pair of first bit lines BLa corresponding thereto and a pair of second bit lines BLb corresponding thereto. In this case, one first bit line and one second bit line of the pair Pa of the first bit lines BLa and the pair Pb of the second bit lines BLb overlapping each cell plug may be connected to the first channel pattern CHa and the second channel pattern CHb included in each cell plug, and the remaining may be connected to another cell plug.

Figure 9:
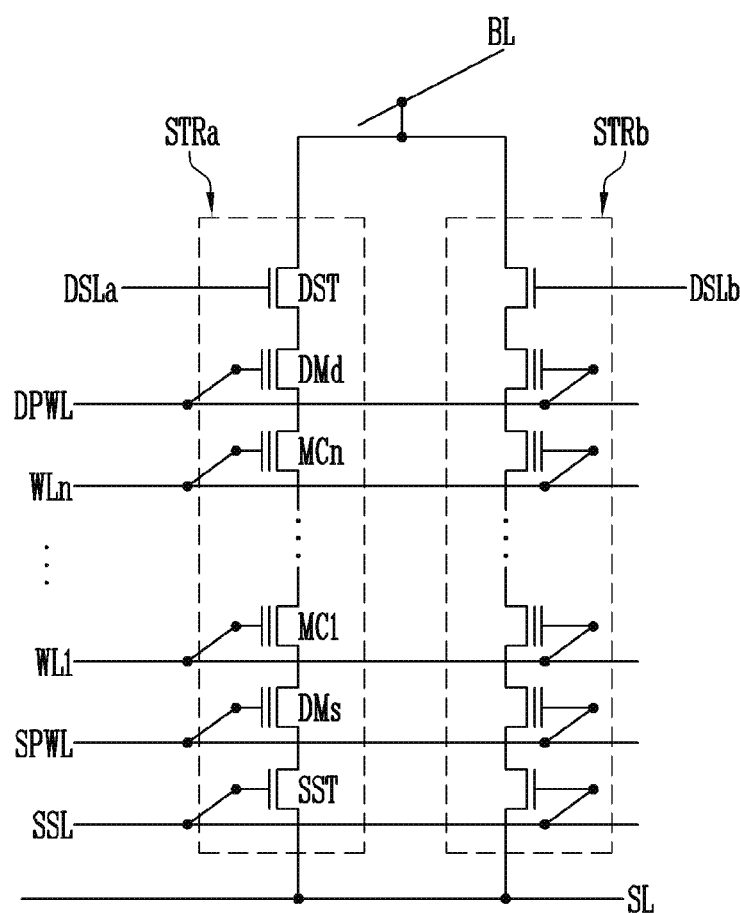
FIG. 9 is a circuit diagram illustrating a first memory cell string and a second memory cell string according to an embodiment of the present disclosure.

FIG. 9 is a circuit diagram illustrating a first memory cell string STRa and a second memory cell string STRb according to an embodiment of the present disclosure.

Referring to FIG. 9, the first memory cell string STRa and the second memory cell string STRb may be connected to the bit line BL and the source line SL.

Each of the first memory cell string STRa and the second memory cell string STRb may include at least one source select transistor SST connected to the source line SL, at least one drain select transistor DST connected to a bit line BL corresponding thereto, and a plurality of memory cells MC1 to MCn connected in series between the drain select transistor DST and the source select transistor SST. Each of the first memory cell string STRa and the second memory cell string STRb may further include at least one source side dummy cell DMs connected between the plurality of memory cells MC1 to MCn and the source select transistor SST. Each of the first memory cell string STRa and the second memory cell string STRb may further include at least one drain side dummy cell DMd connected between the plurality of memory cells MC1 to MCn and the drain select transistor DST. At least one of the source side dummy cell DMs or the drain side dummy cell DMd may be omitted.

The first memory cell string STRa and the second memory cell string STRb may be commonly connected to a source select line SSL used as a source select gate electrode of the source select transistor SST. The first memory cell string STRa and the second memory cell string STRb may be commonly connected to a source side dummy word line SPWL used as a gate electrode of the source side dummy cell DMs. The first memory cell string STRa and the second memory cell string STRb may be commonly connected to each of the word lines WL1 to WLn used as cell gate electrodes of the memory cells MC1 to MCn. The first memory cell string STRa and the second memory cell string STRb may be commonly connected to a drain side dummy word line DPWL used as a gate electrode of the drain side dummy cell DMd. The first memory cell string STRa may be connected to a first drain select line DSLa used as a drain select gate electrode of the drain select transistor DST corresponding thereto. The second memory cell string STRb may be connected to a second drain select line DSLb used as a drain select gate electrode of the drain select transistor DST corresponding thereto.

The first memory cell string STRa and the second memory cell string STRb are connected to different first drain select lines DSLa and second drain select lines DSLb, respectively. Therefore, by individually controlling signals applied to the first drain select line DSLa and the second drain select line DSLb, one of the first memory cell string STRa and the second memory cell string STRb may be selected.

Figure 10:
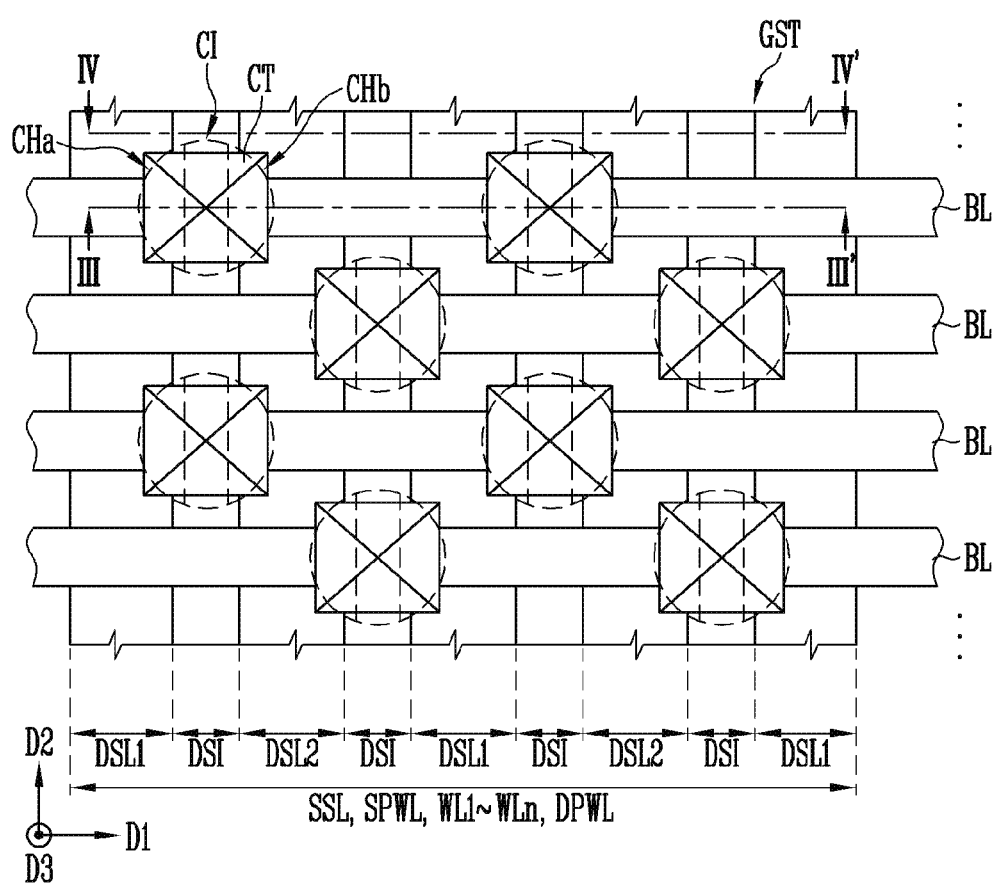
FIG. 10 is a plan view illustrating a semiconductor memory device according to an embodiment of the present disclosure.

FIG. 10 is a plan view illustrating a semiconductor memory device according to an embodiment of the present disclosure. FIG. 10 illustrates an embodiment of the bit lines BL and the gate stack GST that may configure the circuit shown in FIG. 9.

Referring to FIG. 10, the semiconductor memory device may include the gate stack GST and the plurality of bit lines BL overlapping the gate stack GST. The gate stack GST may include a plurality of conductive patterns SSL, SPWL, WL1 to WLn, and DPWL, and a plurality of first and second upper conductive patterns DSL1 and DSL2.

Each of the bit lines BL may be commonly connected to a pair of first channel pattern CHa and second channel pattern CHb included in a cell plug corresponding thereto via a contact plug CT corresponding thereto. The cell plug may include a channel separation pattern CI and the pair of first channel pattern CHa and second channel pattern CHb facing each other with the channel separation pattern CI interposed therebetween. Each of the first channel pattern CHa and the second channel pattern CHb may include a first sidewall facing a sidewall of the channel separation pattern CI and a second sidewall facing the gate stack GST. The second sidewall may have a curvature greater than a curvature of the first sidewall.

Each of the conductive patterns SSL, SPWL, WL1 to WLn, and DPWL may be penetrated by the first channel pattern CHa, the second channel pattern CHb, and the channel separation pattern CI extending in a vertical direction D3. The conductive patterns SSL, SPWL, WL1 to WLn, and DPWL may extend in first and second directions D1 and D2 to surround the channel separation pattern CI and the pair of first channel pattern CHa and second channel pattern CHb configuring the cell plug corresponding thereto. The first and second directions D1 and D2 may be perpendicular to the vertical direction D3 and may cross each other. The conductive patterns may include at least one source select line SSL and a plurality of word lines WL1 to WLn. The conductive patterns may further include at least one of a source side dummy word line SPWL or a drain side dummy word line DPWL.

First upper conductive patterns DSL1 and second upper conductive patterns DSL2 may be spaced apart from each other by upper separation structures DSI. The first upper conductive patterns DSL1 and the second upper conductive patterns DSL2 may configure a plurality of pairs. The first upper conductive pattern DSL1 and the second upper conductive pattern DSL2 included in each pair of the first upper conductive patterns DSL1 and the second upper conductive patterns DSL2 may be disposed on both sides of the upper separation structure DSI corresponding thereto. Each of the first upper conductive patterns DSL1 and the second upper conductive patterns DSL2 and each of the upper separation structures DSI may extend in the second direction D2. The first upper conductive patterns DSL1, the second upper conductive patterns DSL2, and the upper separation structures DSI may overlap each of the conductive patterns SSL, SPWL, WL1 to WLn, and DPWL.

One of each pair of the first upper conductive pattern DSL1 and the second upper conductive pattern DSL2 may be used as the first drain select line DSLa described above with reference to FIG. 9, and the other may be used as the second drain select line DSLb. Each pair of the first upper conductive pattern DSL1 and the second upper conductive pattern DSL2 may be connected to the pair of the first channel pattern CHa and the second channel pattern CHb corresponding thereto, respectively. For example, one of each pair of the first upper conductive pattern DSL1 and the second upper conductive pattern DSL2 may surround a sidewall of the first channel pattern CHa corresponding thereto, and the other may surround a sidewall of the second channel pattern CHb corresponding thereto. At this time, the upper separation structure DSI disposed between each pair of the first upper conductive pattern DSL1 and the second upper conductive pattern DSL2 may be penetrated by the channel separation pattern CI extending in the second direction D2. The upper separation structure DSI may be formed to be wider than the channel separation pattern CI in the first direction D1. In this case, each of the first channel pattern CHa and the second channel pattern CHb disposed on both sides of the channel separation pattern CI may include a portion passing through the upper separation structure DSI.

The bit lines BL may extend in the first direction D1 and may be spaced apart from each other in the second direction D2. Each of the bit lines BL may be shared by the pair of first channel pattern CHa and second channel pattern CHb corresponding thereto via the contact plug CT. The contact plug CT may overlap the channel separation pattern CI and may extend to overlap the first channel pattern CHa and the second channel pattern CHb on both sides of the channel separation pattern CI.

Figure 11A:
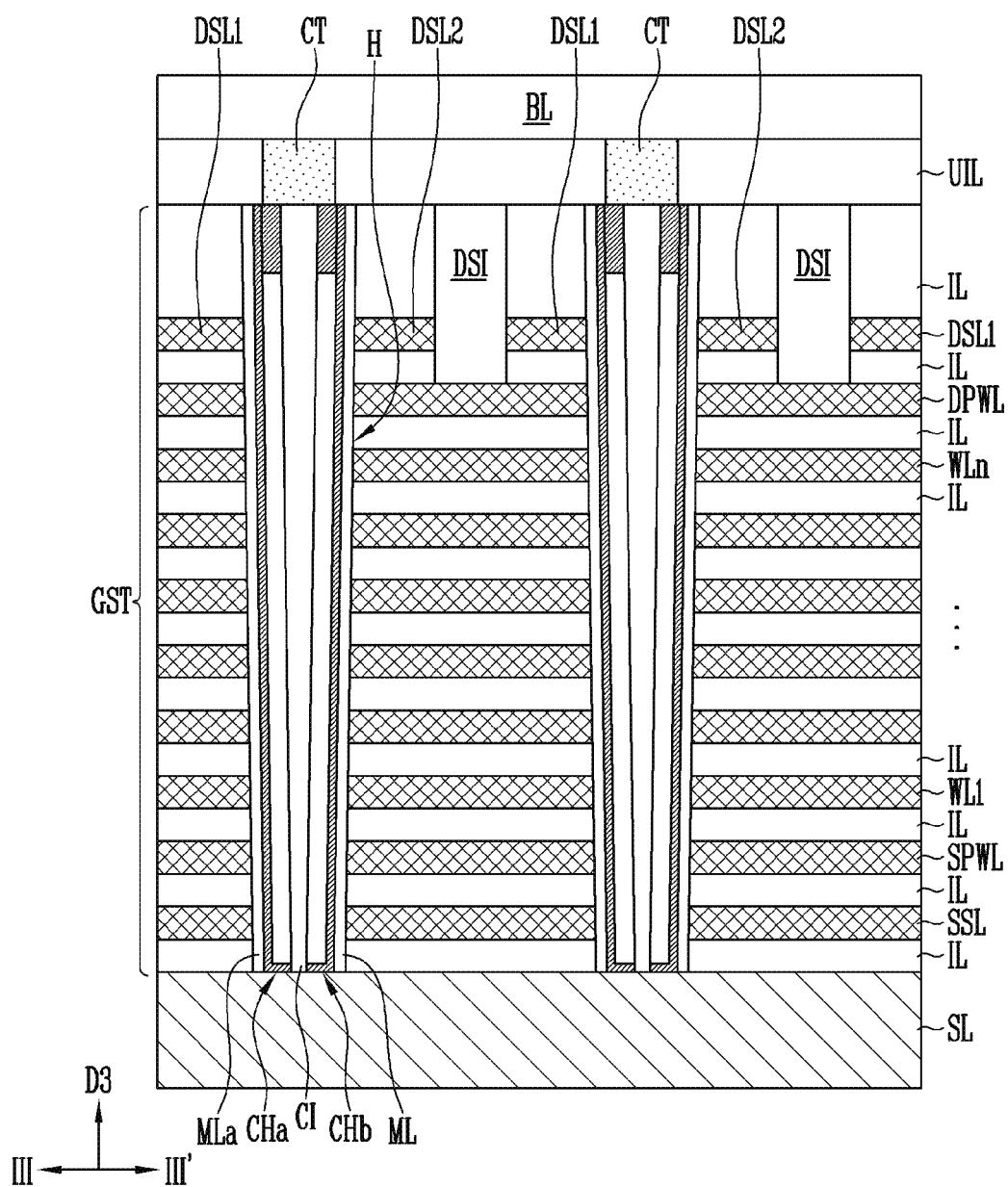
FIGS. 11A and 11B are cross-sectional views of the semiconductor memory device shown in FIG. 10.
Figure 11B:
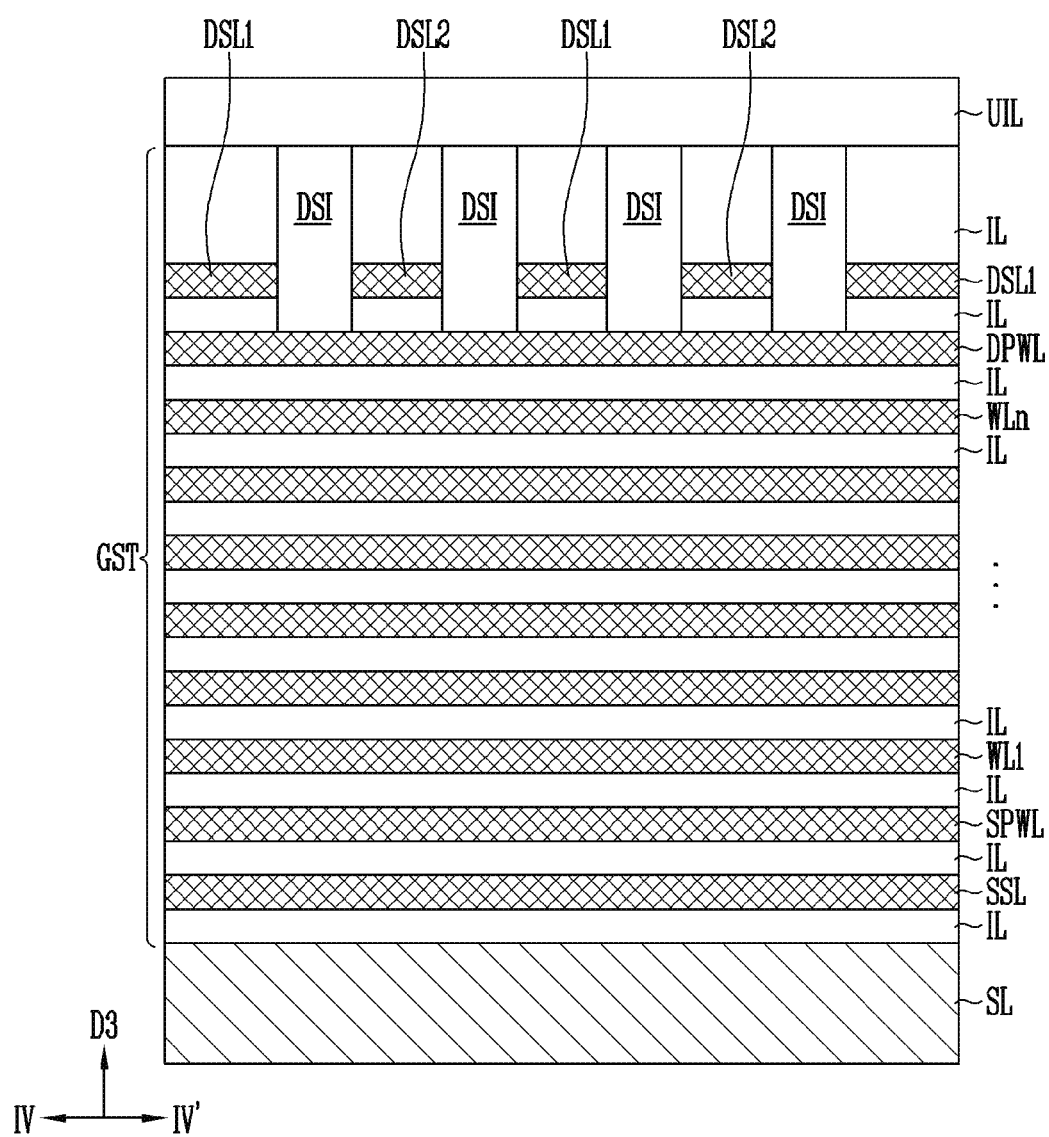

FIGS. 11A and 11B are cross-sectional views of the semiconductor memory device shown in FIG. 10. FIG. 11A illustrates a cross section of the semiconductor memory device taken along a line III-III' of FIG. 10, and FIG. 11B illustrates a cross section of the semiconductor memory device taken along a line IV-IV' of FIG. 10.

Referring to FIGS. 11A and 11B, the gate stack GST may be disposed between the source line SL and an upper insulating film UIL. The gate stack GST may include the conductive patterns SSL, SPWL, WL1 to WLn, and DPWL which are stacked apart from each other in the vertical direction D3, and the first upper conductive pattern DSL1 and the second upper conductive pattern DSL2 which are spaced apart from the conductive patterns SSL, SPWL, WL1 to WLn, and DPWL in the vertical direction D3 and separated from each other by the upper separation structures DSI. The gate stack GST may further include interlayer insulating films IL stacked apart from each other in the vertical direction D3. Each of the conductive patterns SSL, SPWL, WL1 to WLn, and DPWL, the first upper conductive pattern DSL1, and the second upper conductive pattern DSL2 may be disposed between the interlayer insulating films IL adjacent to each other in the vertical direction D3. In other words, the interlayer insulating films IL may be stacked alternately with the conductive patterns SSL, SPWL, WL1 to WLn, and DPWL in the vertical direction D3.

The gate stack GST may be penetrated by the hole H. Some of each of the upper separation structures DSI may be penetrated by the hole H. The first channel pattern CHa may be disposed on one sidewall of the hole H as described above with reference to FIGS. 2A and 2B, and the second channel pattern CHb may be disposed on the other sidewall of the hole H as described above with reference to FIGS. 2A and 2B.

Each of the first channel pattern CHa and the second channel pattern CHb may include the core insulating film CO and the channel film CL as described above with reference to FIGS. 3A and 3B. The channel film CL may include the first semiconductor film SE1, and the second semiconductor film SE2 formed between the first semiconductor film SE1 and the channel separation pattern CI and disposed on the core insulating film CO as described above with reference to FIGS. 6A and 6B.

The first memory pattern MLa may be formed on a sidewall of the first channel pattern CHa, and the second memory pattern MLb may be formed on a sidewall of the second channel pattern CHb. The first memory pattern MLa and the second memory pattern MLb may extend in the vertical direction D3. Each of the first memory pattern MLa and the second memory pattern MLb may include the tunnel insulating film TI, the data storage film DL, and the blocking insulating film BI, as described above with reference to FIGS. 3A and 3B.

The upper insulating film UIL may be penetrated by the contact plug CT. The bit lines BL shown in FIG. 10 may be disposed on the upper insulating film UIL, and may be spaced apart from the gate stack GST by the upper insulating film UIL. The contact plug CT may extend from a pair of first channel pattern CHa and second channel pattern CHb corresponding thereto toward the bit line BL corresponding thereto.

The upper separation structures DSI may be formed at a depth that does not pass through the conductive patterns SSL, SPWL, WL1 to WLn, and DPWL, and may overlap the conductive patterns SSL, SPWL, WL1 to WLn, and DPWL.

Figure 12:
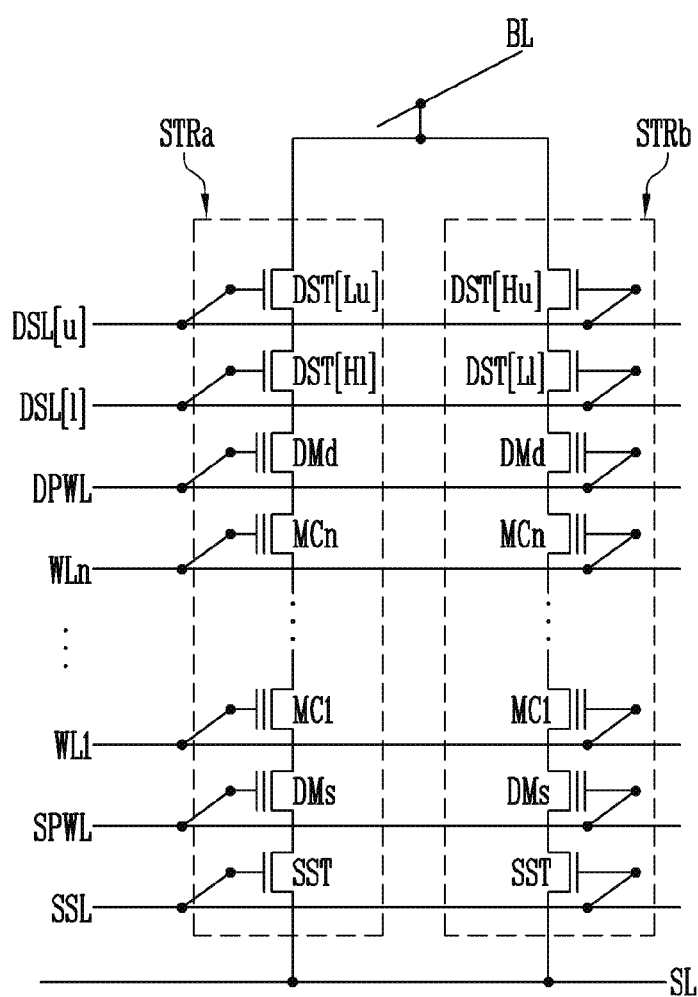
FIG. 12 is a circuit diagram illustrating a first memory cell string and a second memory cell string according to an embodiment of the present disclosure.

FIG. 12 is a circuit diagram illustrating a first memory cell string STRa and a second memory cell string STRb according to an embodiment of the present disclosure.

Referring to FIG. 12, the first memory cell string STRa and the second memory string STRb may be connected to the bit line BL and the source line SL.

Each of the first memory cell string STRa and the second memory cell string STRb may include at least one source select transistor SST connected to the source line SL and a plurality of memory cells MC1 to MCn connected to the source select transistor SST and connected in series. Each of the first memory cell string STRa and the second memory cell string STRb may further include at least one source side dummy cell DMs connected between the plurality of memory cells MC1 to MCn and the source select transistor SST.

The first memory cell string STRa may include a first lower drain select transistor DST[Hl] and a first upper drain select transistor DST[Lu] connected in series between the plurality of memory cells MC1 to MCn and the bit line BL corresponding thereto. The first memory cell string STRa may further include a drain side dummy cell DMd disposed between the memory cells MC1 to MCn corresponding thereto and the first lower drain select transistor DST[Hl].

The second memory cell string STRb may include a second lower drain select transistor DST[Ll] and a second upper drain select transistor DST[Hu] connected in series between the memory cells MC1 to MCn and the bit line BL corresponding thereto. The second memory cell string STRb may further include a drain side dummy cell DMd disposed between the memory cells MC1 to MCn corresponding thereto and the second lower drain select transistor DST[Ll].

In each of the first memory cell string STRa and the second memory cell string STRb, at least one of the source side dummy cell DMs and the drain side dummy cell DMd may be omitted.

The first memory cell string STRa and the second memory cell string STRb may be commonly connected to a source select line SSL used as a source select gate electrode of the source select transistor SST. The first memory cell string STRa and the second memory cell string STRb may be commonly connected to a source side dummy word line SPWL used as a gate electrode of the source side dummy cell DMs. The first memory cell string STRa and the second memory cell string STRb may be commonly connected to each of the word lines WL1 to WLn used as cell gate electrodes of the memory cells MC1 to MCn. The first memory cell string STRa and the second memory cell string STRb may be commonly connected to a drain side dummy word line DPWL used as a gate electrode of the drain side dummy cell DMd. The first memory cell string STRa and the second memory cell string STRb may be commonly connected to a lower drain select line DSL[l] used as lower drain select gate electrodes of each of the first lower drain select transistor DST[Hl] and the second lower drain select transistor DST[Ll]. The first memory cell string STRa and the second memory cell string STRb may be commonly connected to an upper drain select line DSL[u] used as upper drain select gate electrodes of each of the first upper drain select transistor DST[Lu] and the second upper drain select transistor DST[Hu].

The first lower drain select transistor DST[Hl] and the second lower drain select transistor DST[Ll] may be formed to have different threshold voltages, and the first upper drain select transistor DST[Lu] and the second upper drain select transistor DST[Hu] may be formed to have different threshold voltages. In addition, the first lower drain select transistor DST[Hl] and the first upper drain select transistor DST[Lu] may be formed to have different threshold voltages, and the second lower drain select transistor DST[Ll] and the second upper drain select transistor DST[Hu] may be formed to have different threshold voltages.

As an embodiment, each of the first lower drain select transistor DST[Hl] and the second upper drain select transistor DST[Hu] may be formed to have threshold voltages higher than the threshold voltages of each of the first upper drain select transistor DST[Lu] and the second lower drain select transistor DST[Ll]. Embodiments of the present disclosure are not limited such an embodiment, but an operation for selecting one of the first memory cell string STRa and the second memory cell string STRb is described based on the embodiment for convenience of description.

Figure 13A:
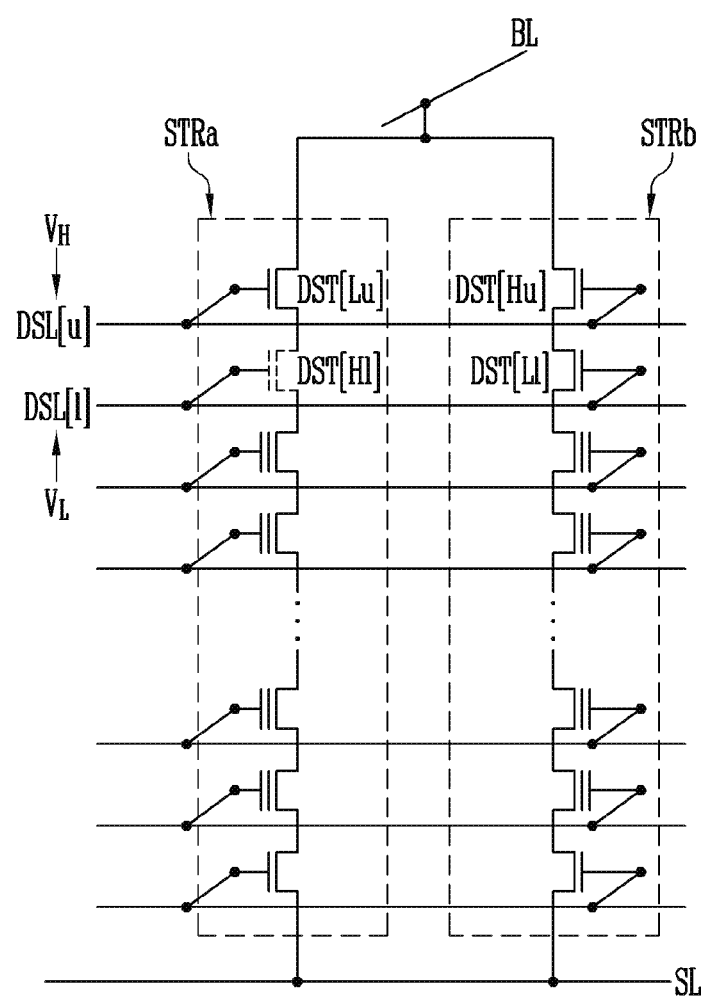
FIGS. 13A and 13B are circuit diagrams illustrating an operation for selecting one of the first memory cell string and the second memory cell string shown in FIG. 12.
Figure 13B:
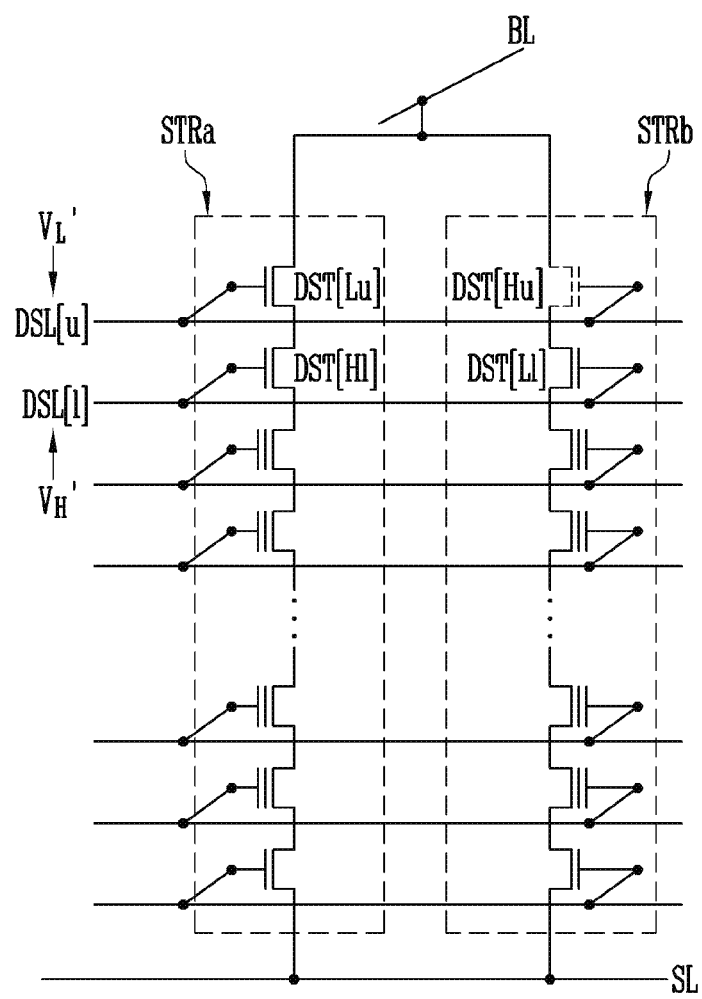

FIGS. 13A and 13B are circuit diagrams illustrating a schematic operation for selecting one of the first memory cell string STRa and the second memory cell string STRb shown in FIG. 12.

Referring to FIG. 13A, in order to select the second memory cell string STRb, a first voltage $V_L$ may be applied to the lower drain select line DSL[l] and a second voltage $V_H$ may be applied to the upper drain select line DSL[u].

The first voltage $V_L$ is may be a level lower than the threshold voltage of the first lower drain select transistor DST[Hl] and higher than the threshold voltage of the second lower drain select transistor DST[Ll] to turn on the second lower drain select transistor DST[Ll]. The first lower drain select transistor DST[H1] having a relatively high threshold voltage may be in an off state even though the first voltage $V_L$ is applied.

The second voltage $V_H$ may be a voltage capable of turning on the first upper drain select transistor DST[Lu] and the second upper drain select transistor DST[Hu], and may be a level higher than the threshold voltage of the second upper drain select transistor DST[Hu].

As described above, the first lower drain select transistor DST[HI] may be in the off state, the second lower drain select transistor DST[LI] may be turned on by the first voltage $V_L$, and the first upper drain select transistor DST[Lu] and the second upper drain select transistor DST[Hu] may be turned on by the second voltage $V_H$. In this case, the second memory string STRb may be selectively connected to the bit line BL.

Referring to FIG. 13B, in order to select the first memory cell string STRa, a third voltage $V_H'$ may be applied to the lower drain select line DSL[l] and a fourth voltage VC maybe applied to the upper drain select line DSL[u].

The third voltage $V_H'$ may be a voltage capable of turning on the first lower drain select transistor DST[HI] and the second lower drain select transistor DST[LI], and may be a level higher than the threshold voltage of the first lower drain select transistor DST[H1].

The fourth voltage $V_L'$ may be a level lower than the threshold voltage of the second upper drain select transistor DST[Hu] and higher than the threshold voltage of the first upper drain select transistor DST[Lu] to turn on the first upper drain select transistor DST[Lu]. The second upper drain select transistor DST[Hu] having a relatively high threshold voltage may be in an off state even though the fourth voltage $V_L'$ is applied.

As described above, the second upper drain select transistor DST[Hu] may be in the off state, the first upper drain select transistor DST[Lu] may be turned on by the fourth voltage $V_L'$, and the first lower drain select transistor DST[HI] and the second lower drain select transistor DST[LI] may be turned on by the third voltage $V_H'$. In this case, the first memory string STRa may be selectively connected to the bit line BL.

Figure 14:
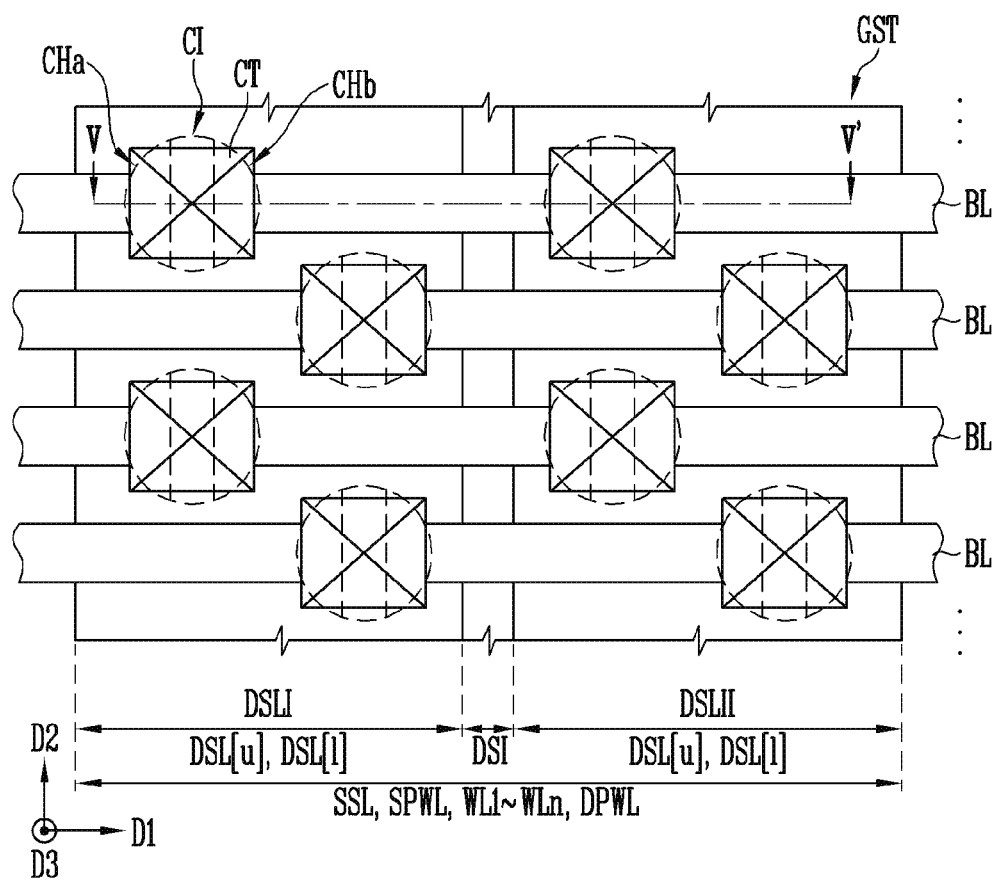
FIG. 14 is a plan view illustrating a semiconductor memory device according to an embodiment of the present disclosure.

FIG. 14 is a plan view illustrating a semiconductor memory device according to an embodiment of the present disclosure. FIG. 14 illustrates an embodiment of the bit lines BL and the gate stack GST that may configure the circuit shown in FIG. 12.

Referring to FIG. 14, the semiconductor memory device may include the gate stack GST and the plurality of bit lines BL overlapping the gate stack GST. The gate stack GST may include a plurality of conductive patterns SSL, SPWL, WL1 to WLn, and DPWL, and at least one pair of first upper conductive pattern group DSLI and a second upper conductive pattern group DSLII.

Each of the bit lines BL may be commonly connected to a pair of first channel pattern CHa and second channel pattern CHb included in a cell plug corresponding thereto via a contact plug CT corresponding thereto. The cell plug may include a channel separation pattern CI and the pair of first channel pattern CHa and second channel pattern CHb facing each other with the channel separation pattern CI interposed therebetween. Each of the first channel pattern CHa and the second channel pattern CHb may include a first sidewall facing a sidewall of the channel separation pattern CI and a second sidewall facing the gate stack GST. The second sidewall may have a curvature greater than a curvature of the first sidewall.

The conductive patterns SSL, SPWL, WL1 to WLn, and DPWL may include at least one source select line SSL and a plurality of word lines WL1 to WLn. The conductive patterns may further include at least one of a source side dummy word line SPWL or a drain side dummy word line DPWL. A layout of the conductive patterns SSL, SPWL, WL1 to WLn, and DPWL is the same as described above with reference to FIG. 10.

The first upper conductive pattern group DSLI and the second upper conductive pattern group DSLII may be spaced apart from each other in the first direction D1 by the upper separation structure DSI extending in the second direction D2. The upper separation structure DSI may overlap the conductive patterns SSL, SPWL, WL1 to WLn, and DPWL. Each of the first upper conductive pattern group DSLI and the second upper conductive pattern group DSLII may extend in first and second directions D1 and D2 to surround the channel separation pattern CI and the pair of first channel pattern CHa and second channel pattern CHb of the cell plug corresponding thereto.

Each of the first upper conductive pattern group DSLI and the second upper conductive pattern group DSLII may have the lower drain select line DSL[I] and the upper drain select line DSL[u] described above with reference to FIG. 12.

The bit lines BL may extend in the first direction D1 and may be spaced apart from each other in the second direction D2. Each of the bit lines BL may be shared by the pair of first channel pattern CHa and second channel pattern CHb corresponding thereto via the contact plug CT. The contact plug CT may overlap the channel separation pattern CI and may extend to overlap the first channel pattern CHa and the second channel pattern CHb on both sides of the channel separation pattern CI.

Figure 15A:
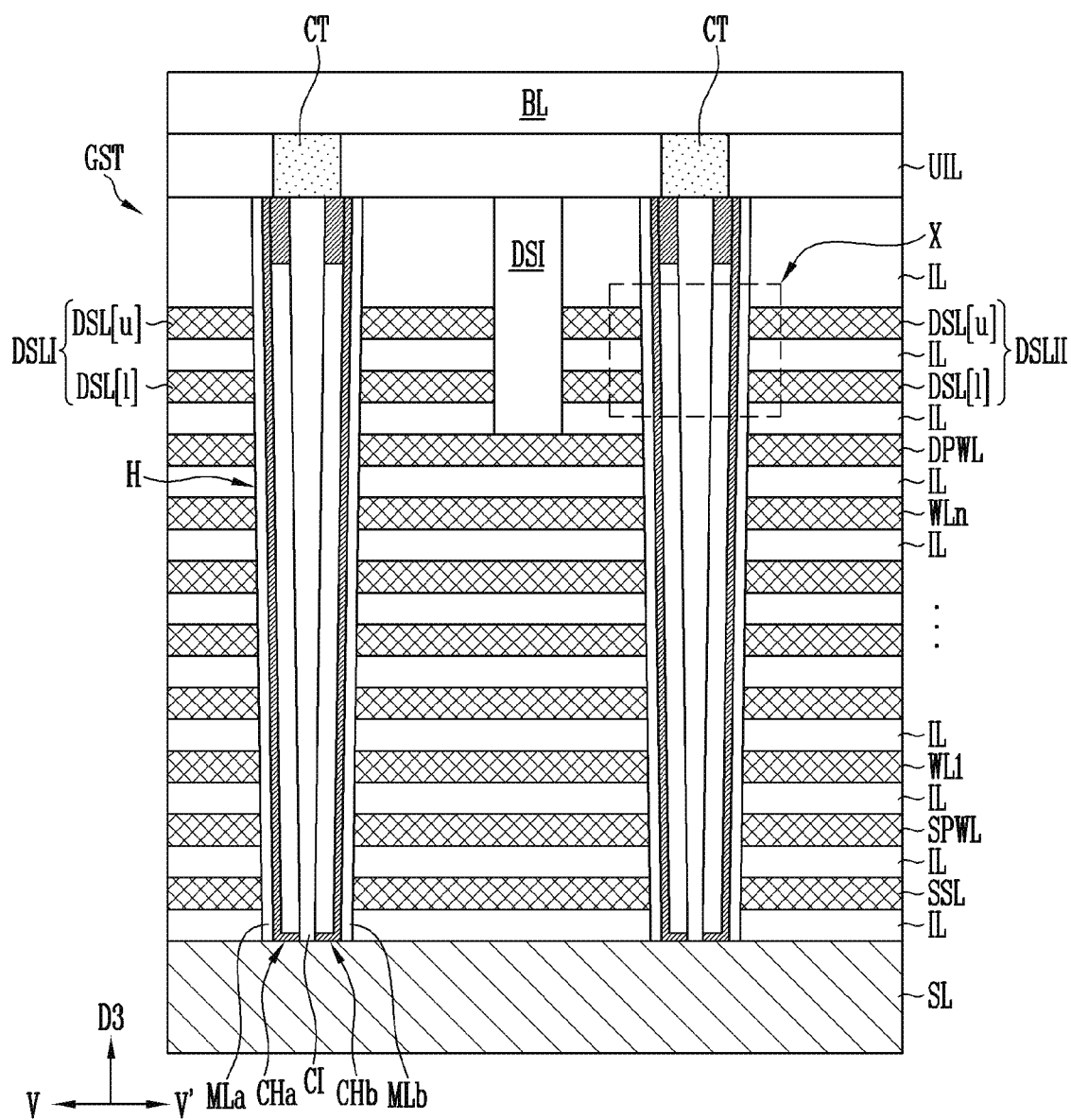
FIGS. 15A and 15B are cross-sectional views of the semiconductor memory device shown in FIG. 14.
Figure 15B:
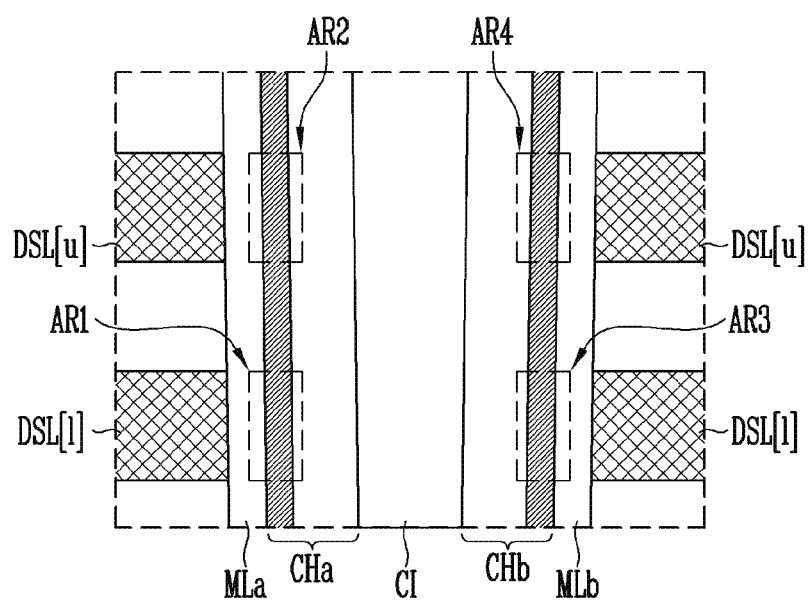

FIGS. 15A and 15B are cross-sectional views of the semiconductor memory device shown in FIG. 14. FIG. 15A illustrates a cross section of the semiconductor memory device taken along a line V-V' shown in FIG. 14, and FIG. 15B illustrates an enlarged cross section of the region X of semiconductor memory device shown in FIG. 15A.

Referring to FIG. 15A, the gate stack GST may be disposed between the source line SL and the upper insulating film UIL. The gate stack GST may include the conductive patterns SSL, SPWL, WL1 to WLn, and DPWL which are stacked apart from each other in the vertical direction D3, and the first upper conductive pattern group DSLI and the second upper conductive pattern group DSLII which are spaced apart from the conductive patterns SSL, SPWL, WL1 to WLn, and DPWL in the vertical direction D3 and separated from each other by the upper separation structure DSI. The lower drain select line DSL[I] and the upper drain select line DSL[u] of each of the first upper conductive pattern group DSLI and the second upper conductive pattern group DSLII may be stacked apart in the vertical direction D3. The gate stack GST may further include interlayer insulating films IL stacked apart in the vertical direction D3. Each of the conductive patterns SSL, SPWL, WL1 to WLn, and DPWL, the lower drain select line DSL[I], and the upper drain select line DSL[u] may be disposed between interlayer insulating films IL adjacent to each other in the vertical direction D3. In other words, the interlayer insulating films IL may be stacked alternately with the conductive patterns SSL, SPWL, WL1 to WLn, and DPWL, the lower drain select line DSL[I], and the upper drain select line DSL[u] in the vertical direction D3.

The gate stack GST may be penetrated by the hole H. The first channel pattern CHa may be disposed on one sidewall of the hole H as described above with reference to FIGS. 2A and 2B, and the second channel pattern CHb may be disposed on the other sidewall of the hole H as described above with reference to FIGS. 2A and 2B.

Each of the first channel pattern CHa and the second channel pattern CHb may include the core insulating film CO and the channel film CL as described above with reference to FIGS. 3A and 3B. As described above with reference to FIGS. 6A and 6B, the channel film CL may include the first semiconductor film SE1 and the second semiconductor film SE2. The second semiconductor film SE2 may be formed between the first semiconductor film SE1 and the channel separation pattern CI, and may be disposed on the core insulating film CO.

The first memory pattern MLa may be formed on a sidewall of the first channel pattern CHa, and the second memory pattern MLb may be formed on a sidewall of the second channel pattern CHb. The first memory pattern MLa and the second memory pattern MLb may extend in the vertical direction D3. Each of the first memory pattern MLa and the second memory pattern MLb may include the tunnel insulating film TI, the data storage film DL, and the blocking insulating film BI, as described above with reference to FIGS. 3A and 3B.

The upper insulating film UIL may be penetrated by the contact plug CT. The bit lines BL shown in FIG. 14 may be disposed on the upper insulating film UIL and may be spaced apart from the gate stack GST by the upper insulating film UIL. The contact plug CT may extend from the pair of first channel pattern CHa and second channel pattern CHb corresponding thereto toward the bit line BL corresponding thereto.

The upper separation structures DSI may be formed at a depth that does not pass through the conductive patterns SSL, SPWL, WL1 to WLn, and DPWL, and may overlap the conductive patterns SSL, SPWL, WL1 to WLn, and DPWL.

Referring to FIG. 15B, the first channel pattern CHa may include a first channel region AR1 facing the lower drain select line DSL[I] and a second channel region AR2 facing the upper drain select line DSL[u]. The second channel pattern CHb may include a third channel region AR3 facing the lower drain select line DSL[I] and a fourth channel region AR4 facing the upper drain select line DSL[u]. The first channel region AR1 and the third channel region AR3 may be formed to have different threshold voltages, and the second channel region AR2 and the fourth channel region AR4 may be formed to have different threshold voltages. In addition, the first channel region AR1 and the second channel region AR2 may be formed to have different threshold voltages, and the third channel region AR3 and the fourth channel region AR4 may be formed to have different threshold voltages.

For example, as in the embodiment described above with reference to FIG. 12, the first lower drain select transistor DST[HI] and the second upper drain select transistor DST[Hu] may have threshold voltages higher than threshold voltages of the first upper drain select transistor DST[Lu] and the second lower drain select transistor DST[LI]. To this end, the threshold voltages of the first channel region AR1 and the fourth channel region AR4 may be higher than the threshold voltages of the second channel region AR2 and the third channel region AR3. The threshold voltages of the first to fourth channel regions AR1 to AR4 may be controlled differently by locally injecting various conductive dopants into the first channel pattern CHa and the second channel pattern CHb and locally differently controlling a dopant injection amount.

Figure 16A:
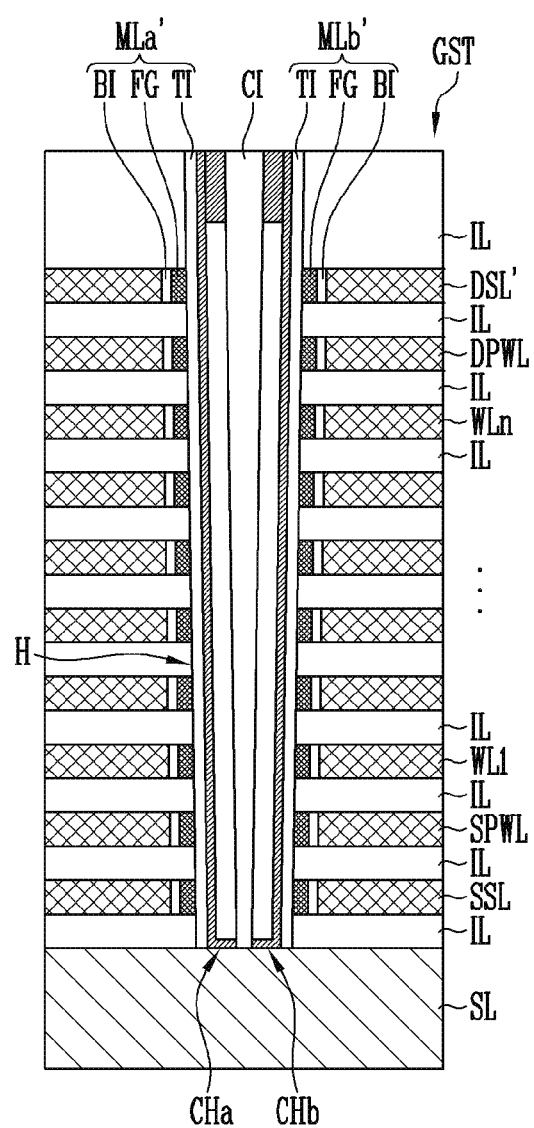
FIGS. 16A and 16B are cross-sectional views illustrating semiconductor memory devices according to various embodiments of the present disclosure.
Figure 16B:
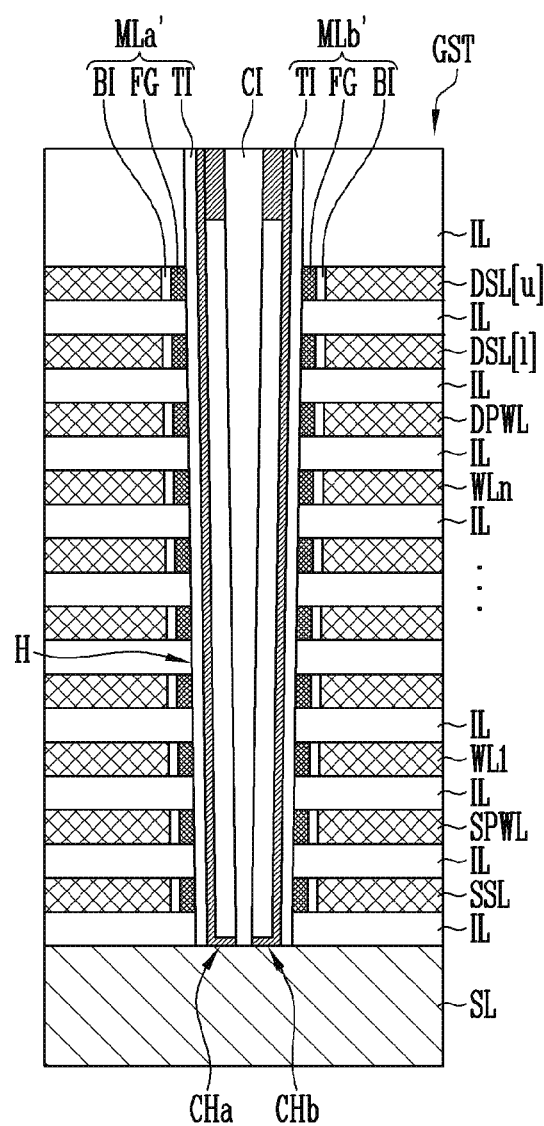

FIGS. 16A and 16B are cross-sectional views illustrating semiconductor memory devices according to various embodiments of the present disclosure.

Referring to FIGS. 16A and 16B, the semiconductor memory device may include a gate stack GST, a hole H passing through the gate stack GST, a first channel pattern CHa formed on one sidewall of the hole H, and a second channel pattern CHb formed on the other sidewall of the hole H.

The gate stack GST may be formed on the source line SL.

As an embodiment, as shown in FIG. 16A, the gate stack GST may include conductive patterns SSL, SPWL, WL1 to WLn, and DPWL which are stacked apart from each other in the vertical direction D3 and an upper conductive pattern DSL' spaced apart from the conductive patterns SSL, SPWL, WL1 to WLn, and DPWL in the vertical direction D3. The gate stack GST may further include interlayer insulating films IL stacked apart in the vertical direction D3. The conductive patterns SSL, SPWL, WL1 to WLn, and DPWL and the upper conductive pattern DSL' may be disposed between the interlayer insulating films IL adjacent to each other in the vertical direction D3. In other words, the interlayer insulating films IL may be alternately stacked in the vertical direction D3 with the conductive patterns SSL, SPWL, WL1 to WLn, and DPWL and the upper conductive pattern DSL'. The conductive patterns SSL, SPWL, WL1 to WLn, and DPWL may include at least one source select line SSL and a plurality of word lines WL1 to WLn. The conductive patterns may further include at least one of a source side dummy word line SPWL or a drain side dummy word line DPWL. Roles of each of the source select line SSL, the plurality of word lines WL1 to WLn, the source side dummy line SPWL, and the drain side dummy line DPWL may be the same as described above with reference the embodiment shown in FIGS. 5, 6A, and 6B, the embodiment shown in FIG. 7, or the embodiment shown in FIG. 8, and the embodiment shown in FIGS. 10, 11A, and 11B.

A role of the upper conductive pattern DSL' may be same as a role of the first upper conductive pattern DSL1 described above with reference to the embodiment shown in FIGS. 5, 6A, and 6B, the embodiment shown in FIG. 7, or the embodiment shown in FIG. 8, and the embodiment shown in FIGS. 10, 11A, and 11B, or may be the same as a role of the second upper conductive pattern DSL2 described above with reference to the embodiment shown in FIGS. 5, 6A, and 6B, the embodiment shown in FIG. 7, or the embodiment shown in FIG. 8, and the embodiment shown in FIGS. 10, 11A, and 11B.

As another embodiment, as shown in FIG. 16B, the gate stack GST may include conductive patterns SSL, SPWL, WL1 to WLn, and DPWL, a lower drain select line DSL[I], an upper drain select line DSL[u], and interlayer insulating films IL. The gate stack GST shown in FIG. 16B may be the same as the gate stack GST described above with reference to FIG. 15A.

Referring to FIGS. 16A and 16B again, a first memory pattern MLa' may be formed on a sidewall of the first channel pattern CHa and a second memory pattern MLb' may be formed on a sidewall of the second channel pattern CHb. Each of the first memory pattern MLa' and the second memory pattern MLb' may include a tunnel insulating film TI, a floating gate film FG formed on a sidewall of the tunnel insulating film TI, and a blocking insulating film BI formed on a sidewall of the floating gate film FG. The tunnel insulating film TI and the blocking insulating film BI are the same as described above with reference to FIGS. 3A and 3B. The floating gate film FG may be a film for data storage and may be formed of a silicon film. Each of the floating gate film FG and the blocking insulating film BI may be separated into a plurality of patterns by the interlayer insulating films IL which are adjacent to each other in the vertical direction D3. The tunnel insulating film TI may extend in the vertical direction D3 along a sidewall of the channel pattern corresponding to the first channel pattern CHa or the second channel pattern CHb. An embodiment of the disclosure is not limited thereto. For example, the tunnel insulating film TI may be separated into a plurality of patterns by the interlayer insulating films IL which are adjacent to each other in the vertical direction D3.

Figure 17A:
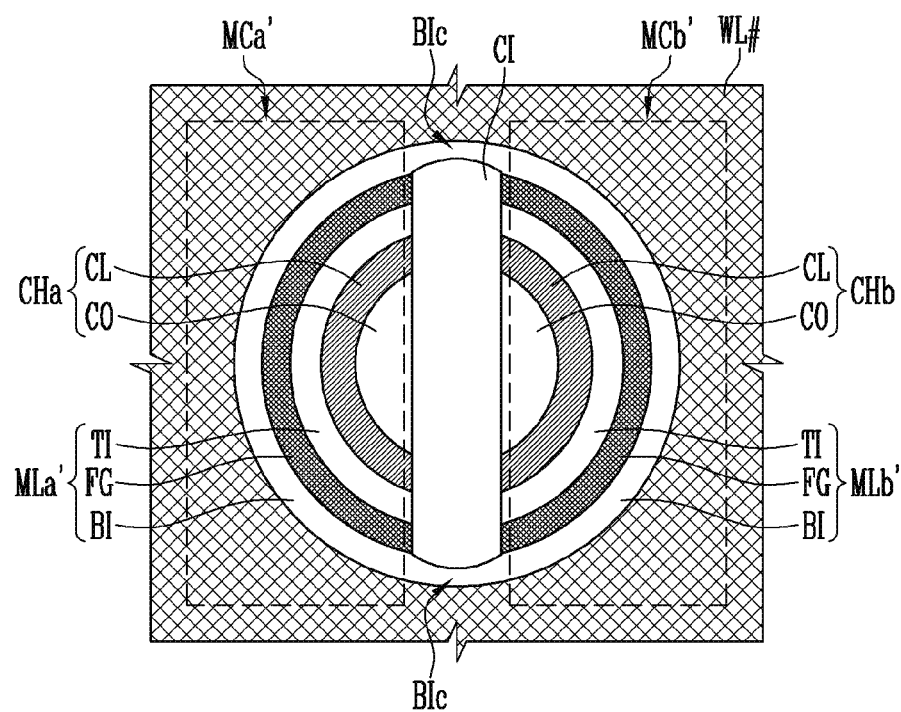
FIGS. 17A and 17B are plan views illustrating various embodiments of a first memory pattern and a second memory pattern shown in FIGS. 16A and 16B.
Figure 17B:
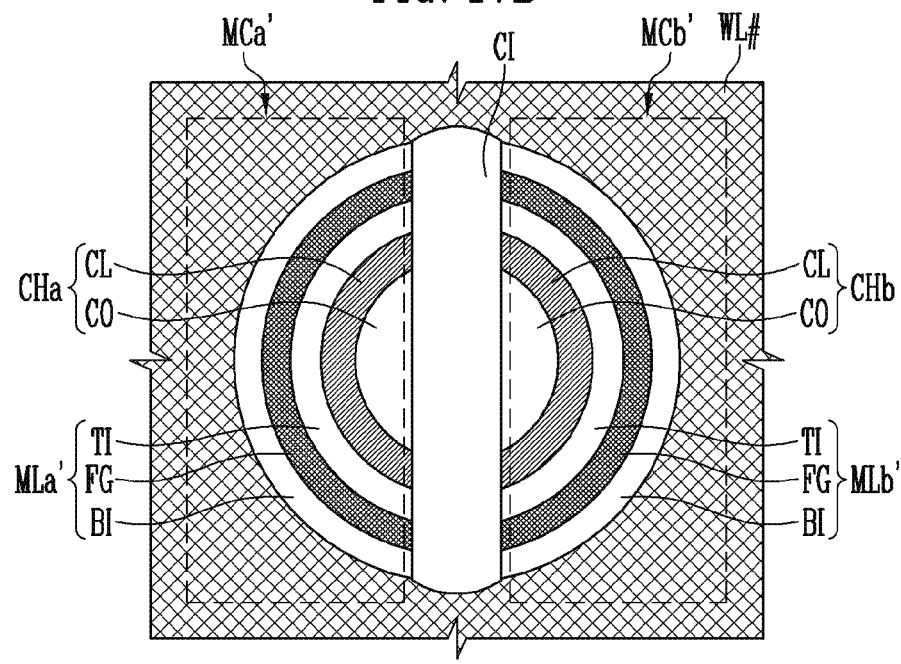

FIGS. 17A and 17B are plan views illustrating various embodiments of the first memory pattern MLa' and the second memory pattern MLb' shown in FIGS. 16A and 16B. FIGS. 17A and 17B illustrate cross-sectional structures of each of the first memory pattern MLa' and the second memory pattern taken in a direction parallel to an arbitrary word line WL# of the word lines WL1 to WLn shown in FIGS. 16A and 16B.

Referring to FIGS. 17A and 17B, a first memory cell MCa' may be defined at an intersection portion of the word line WL# and the first channel pattern CHa, and a second memory cell MCb' may be defined at an intersection portion of the word line WL# and the second channel pattern CHb. The first memory cell MCa' and the second memory cell MCb' may be separated from each other by the channel separation pattern CI corresponding thereto.

Each of the first channel pattern CHa and the second channel pattern CHb may include the core insulating film CO and the channel film CL as described above with reference to FIGS. 3A and 3B.

Each of the first memory pattern MLa' and the second memory pattern MLb' may include a tunnel insulating film TI, a floating gate film FG formed on a sidewall of the tunnel insulating film TI, and a blocking insulating film BI formed on a sidewall of the floating gate film FG. Each of the tunnel insulating film TI and the floating gate film FG may be separated into the first memory pattern MLa' and the second memory pattern MLb' by the channel separation pattern CI.

As an embodiment, the blocking insulating film BI may extend on the sidewall of the channel separation pattern CI. For example, as shown in FIG. 17A, the blocking insulating film BI may include an extension portion BIc extending on the sidewall of the channel separation pattern CI.

As another embodiment, the blocking insulating film BI may be separated into the first memory pattern MLa' and the second memory pattern MLb' by the channel separation pattern CI as shown in FIG. 17B.

Figure 18:
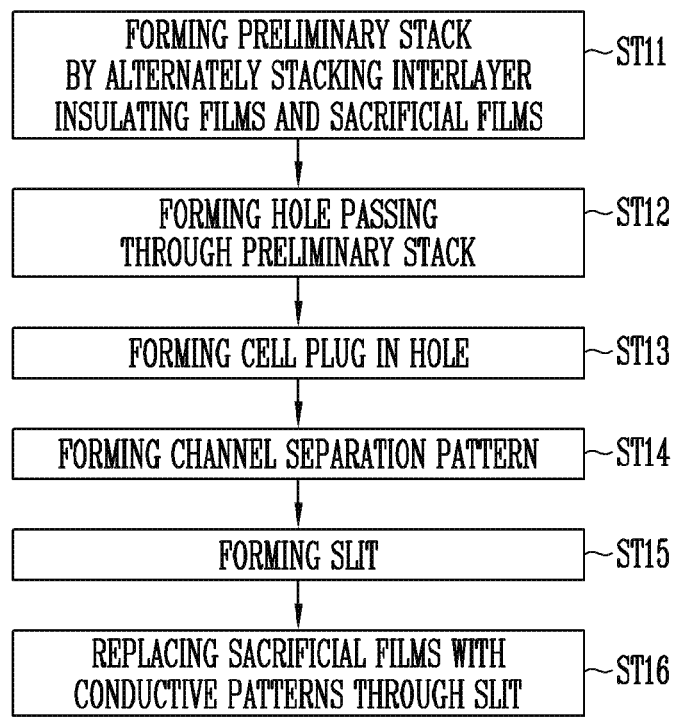
FIGS. 18 to 20 are flowcharts schematically illustrating methods of manufacturing a semiconductor memory device according to embodiments.
Figure 19:
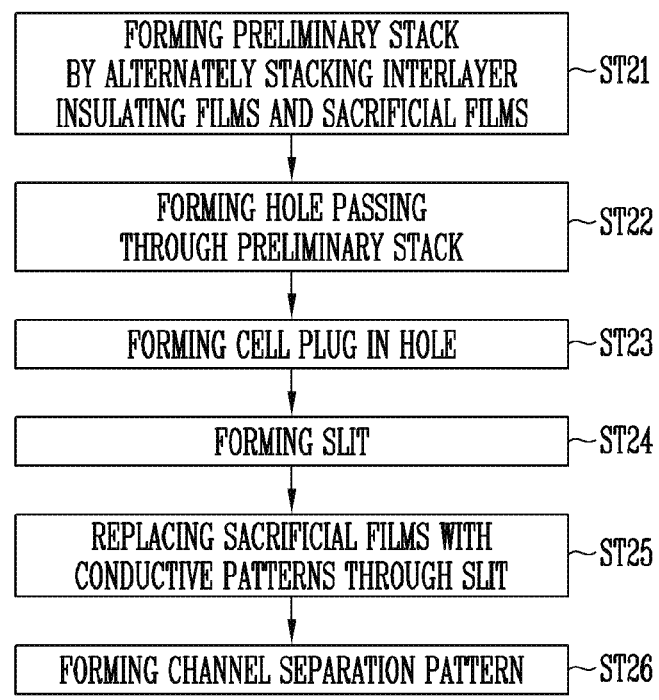
Figure 20:
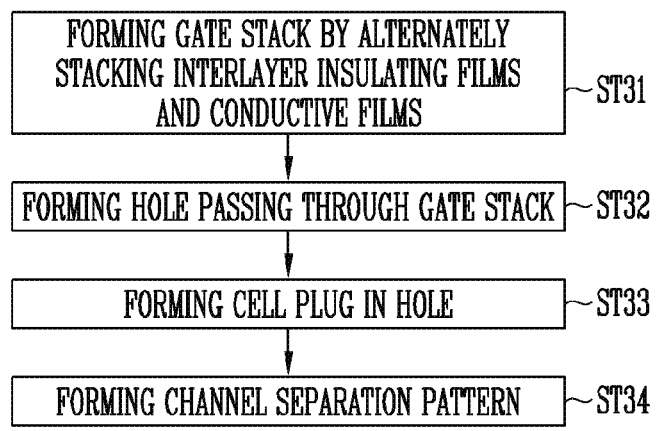

FIGS. 18 to 20 are flowcharts schematically illustrating methods of manufacturing a semiconductor memory device according to embodiments.

Referring to FIG. 18, the method of manufacturing the semiconductor memory device may include steps ST11 to ST16.

Step ST11 may include alternately stacking interlayer insulating films and sacrificial films on a lower structure. The lower structure may be the source line described above with reference to FIGS. 6A and 6B, 11A and 11B, and 15A. An embodiment of the disclosure is not limited thereto. For example, the lower structure may be a pipe gate film or a doped semiconductor film.

The interlayer insulating films may include silicon oxide. The sacrificial films may be formed of a material that may be selectively removed. For example, the sacrificial films may include silicon nitride.

Step ST12 may include forming a hole passing through a preliminary stack.

Step ST13 may include forming a cell plug in the hole. As an embodiment, the cell plug may include the core insulating film CO, the channel film CL, the tunnel insulating film TI, the data storage film DL, and the blocking insulating film BI described above with reference to FIGS. 3A and 3B. As another embodiment, the cell plug may include the core insulating film CO, the channel film CL, the tunnel insulating film TI, the floating gate film FG, and the blocking insulating film BI described above with reference to FIGS. 16A and 16B and FIGS. 17A and 17B.

Step ST14 may include forming a channel separation pattern. The channel separation pattern may be formed to implement any one of the embodiments described above with reference to FIGS. 3A, 3B, 17A, and 17B.

Step ST15 may include forming a slit passing through the preliminary stack.

Step ST16 may include replacing the sacrificial films of the preliminary stack with conductive patterns through a slit. To this end, after selectively removing the sacrificial films through the slit, a region from which the sacrificial films are removed may be filled with a conductive material.

Referring to FIG. 19, the method of manufacturing the semiconductor memory device may include steps ST21 to ST26.

Steps ST21, ST22, and ST23 are the same as steps ST11, ST12, and ST13 described above with reference to FIG. 18, respectively.

Steps ST24 and ST25 are the same as steps ST15 and ST16 described above with reference to FIG. 18, respectively.

Step ST26 is the same as step ST14 described above with reference to FIG. 18. However, the channel separation pattern may be formed after conductive patterns are formed differently from the embodiment described above with reference to FIG. 18.

Referring to FIG. 20, the method of manufacturing the semiconductor memory device may include steps ST31 to ST34.

Step ST31 may include forming a gate stack by alternately stacking interlayer insulating films and conductive films on a lower structure. The lower structure may be the source line described above with reference to FIGS. 6A and 6B, 11A and 11B, and 15A. An embodiment of the disclosure is not limited thereto. For example, the lower structure may be a pipe gate film or a doped semiconductor film.

Step ST32 may include forming a hole passing the gate stack.

Step ST33 may be the same as step ST13 described above with reference to FIG. 18.

Step ST34 is the same as step ST14 described above with reference to FIG. 18. However, the channel separation pattern may be formed after conductive films are formed differently from the embodiment described above with reference to FIG. 18.

As described above with reference to FIGS. 19 and 20, when the channel separation pattern is formed after the conductive patterns or the conductive films are formed, the conductive patterns or the conductive films may be used as an etch stop film. Hereinafter, an embodiment in which the conductive patterns or the conductive films are used as an etch stop film while forming the channel separation pattern is described with reference to FIGS. 21, 22A, 22B, and 23 to 25.

Figure 21:
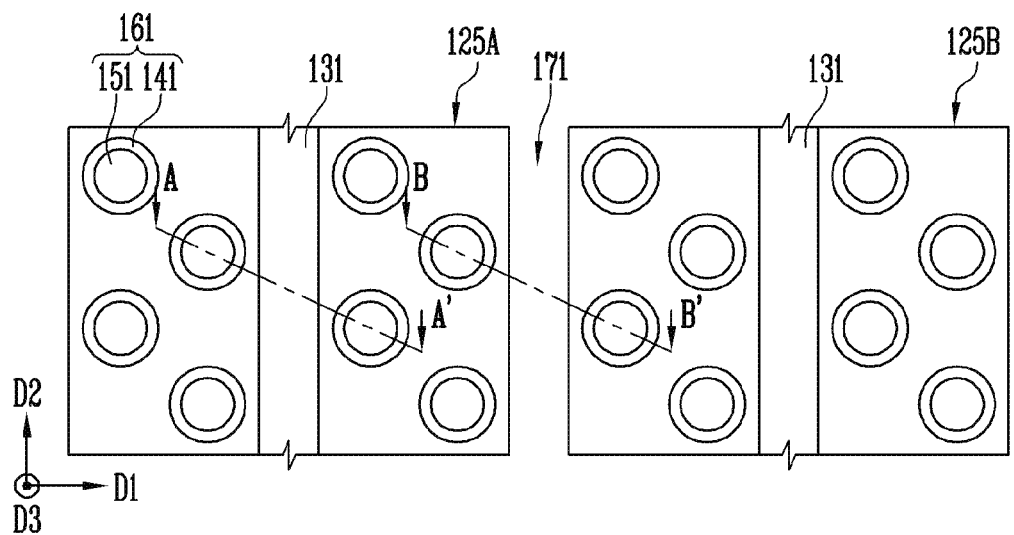
FIG. 21 is a plan view illustrating gate stacks separated by a slit.
Figure 22A:
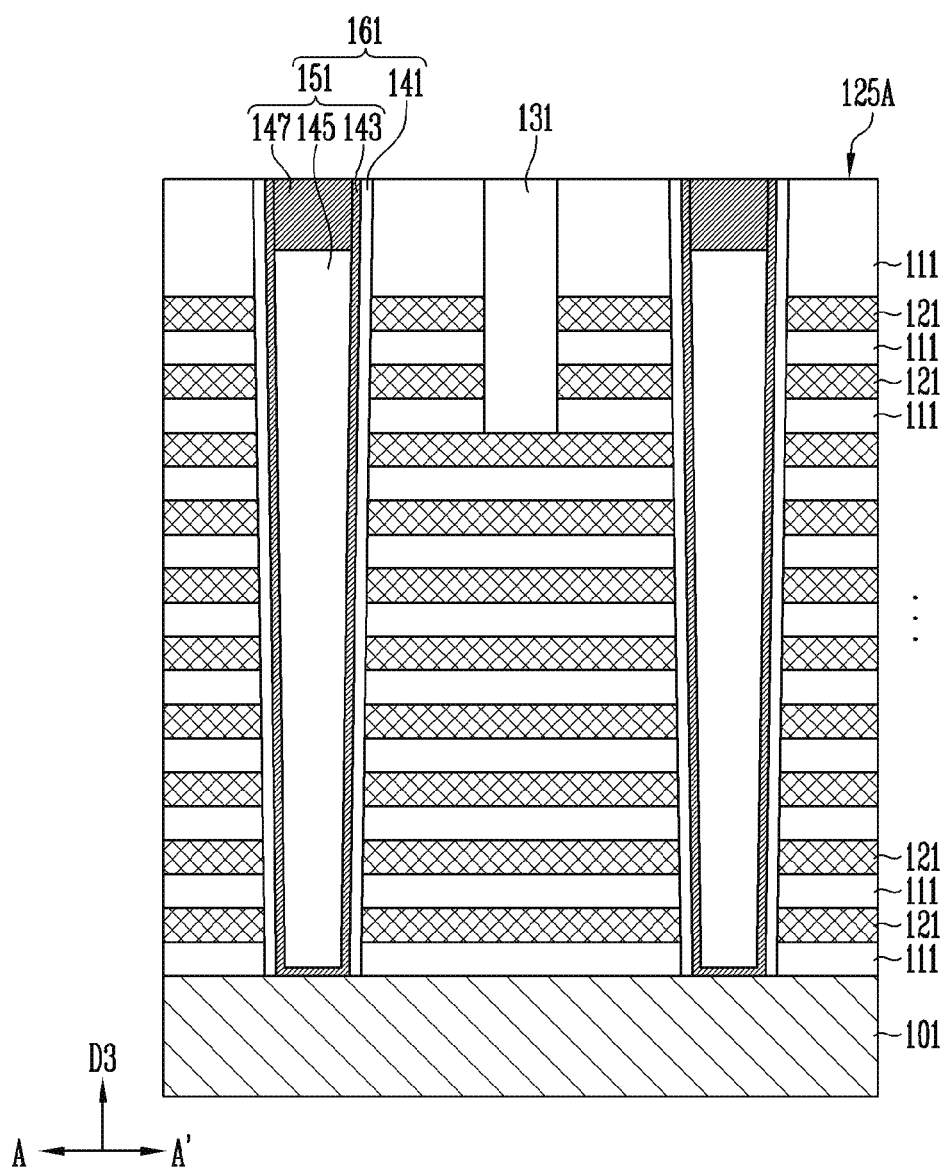
FIGS. 22A and 22B are cross-sectional views of the gate stacks shown in FIG. 21.
Figure 22B:
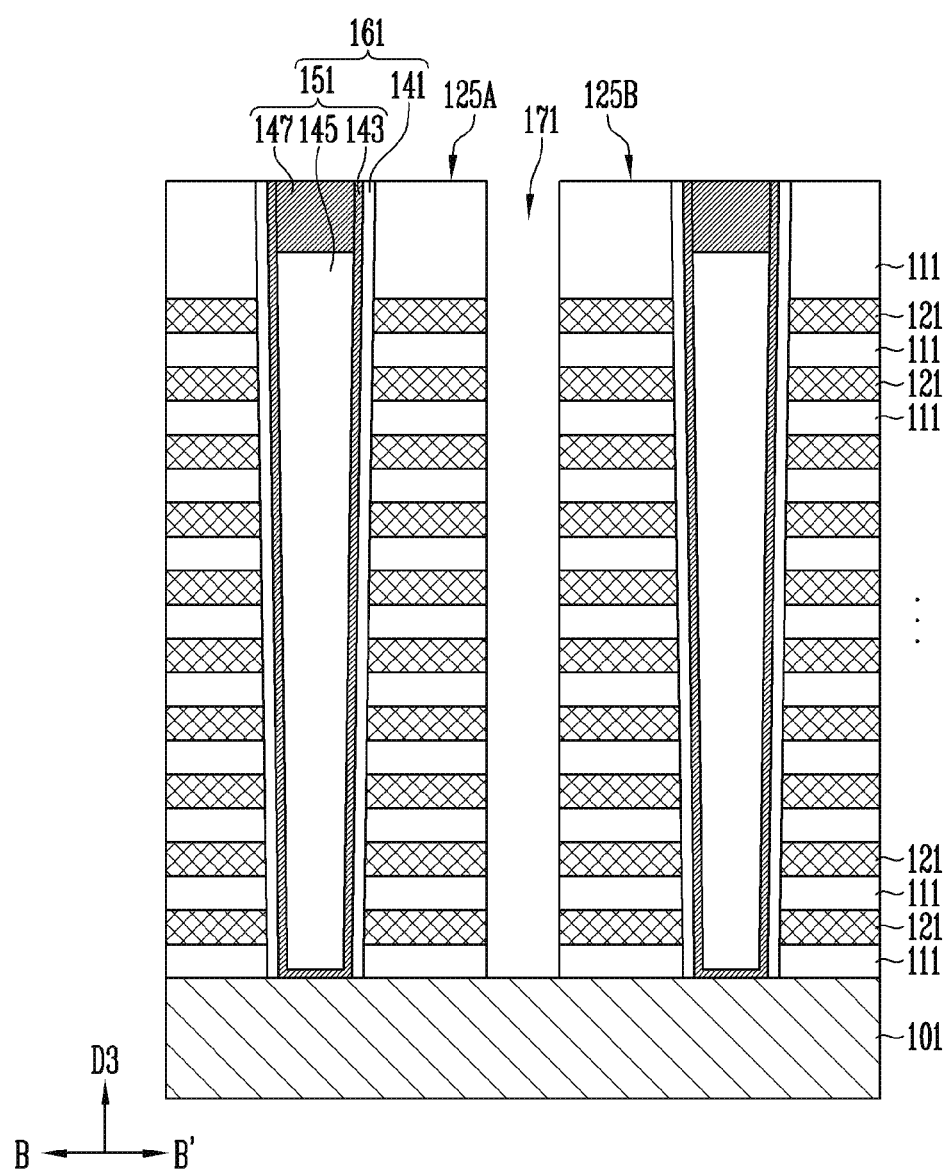

FIG. 21 is a plan view illustrating gate stacks 125A and 125B separated by a slit 171. FIGS. 22A and 22B are cross-sectional views of the gate stacks 125A and 125B shown in FIG. 21. FIG. 22A is a cross-sectional view taken along a line A-A' of FIG. 21, and FIG. 22B is a cross-sectional view taken along a line B-B' of FIG. 21.

Referring to FIGS. 21, 22A, and 22B, the gate stacks 125A and 125B penetrated by cell plugs 161 may be formed through steps ST21 to ST25 described above with reference to FIG. 19 or steps ST31 to ST33 described above with reference to FIG. 20.

The gate stacks 125A and 125B may include interlayer insulating films 111 and gate electrodes 121 that are alternately stacked on a lower structure 101. The gate electrodes 121 may be the conductive patterns described above with reference to FIG. 19 or the conductive films described above with reference to FIG. 20. The lower structure 101 may be a source line.

Before forming the cell plugs 161 or after forming the cell plugs 161, an upper separation structure 131 may be formed. The upper separation structure 131 may extend in the vertical direction D3 to pass through the uppermost film of the gate electrodes 121. Each of the gate electrodes 121 may extend in the first direction D1 and the second direction D2 crossing each other in a plane perpendicular to the vertical direction D3. Each of the gate electrodes 121 may be formed of various conductive materials. For example, each of the gate electrodes 121 may include at least one of a metal film, a doped semiconductor film, or a metal silicide film. In an embodiment, each of the gate electrodes 121 may be formed of a metal film including tungsten for a low resistance wire.

The gate stacks 125A and 125B may be spaced apart from each other in the first direction D1 by the slit 171. The slit 171 and the upper separation structure 131 may extend in the second direction D2.

The cell plugs 161 may include a memory film 141 and a channel structure 151. The channel structure 151 may include a first semiconductor film 143, a core insulating film 145, and a second semiconductor film 147. The memory film 141 may include the blocking insulating film BI, the data storage film DL, and the tunnel insulating film TI described above with reference to FIGS. 3A and 3B, or the blocking insulating film BI, the floating gate film FG, and tunnel insulating film TI described above with reference to FIGS. 17A and 17B. The first semiconductor film 143 may be formed on a surface of the memory film 141 in a liner type. The core insulating film 145 may fill a central region of the first semiconductor film 143 at a height lower than a height of the first semiconductor film 143. The second semiconductor film 147 may be disposed on the core insulating film 145 and may fill an upper portion of the center region of the first semiconductor film 143.

Figure 23:
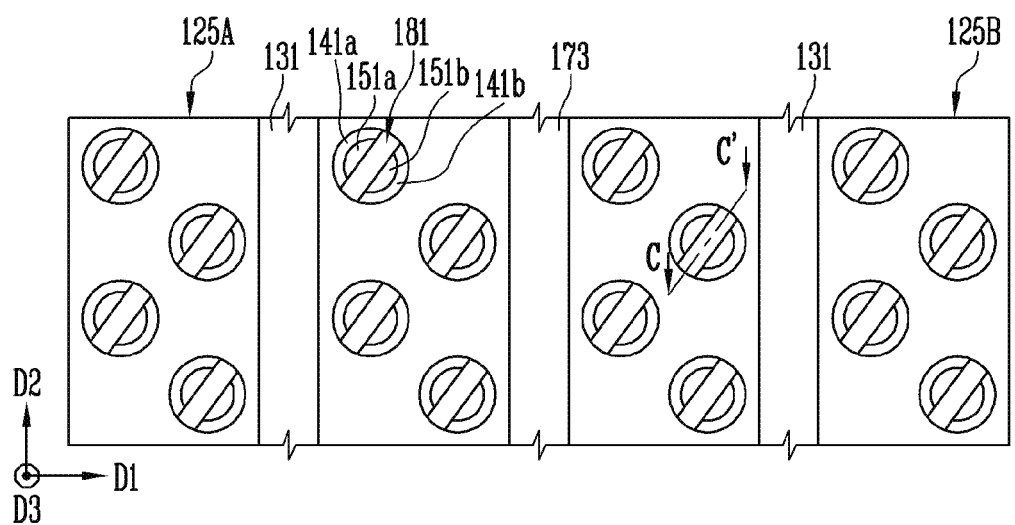
FIGS. 23 to 25 are diagrams illustrating a process of forming a channel separation pattern.
Figure 24:
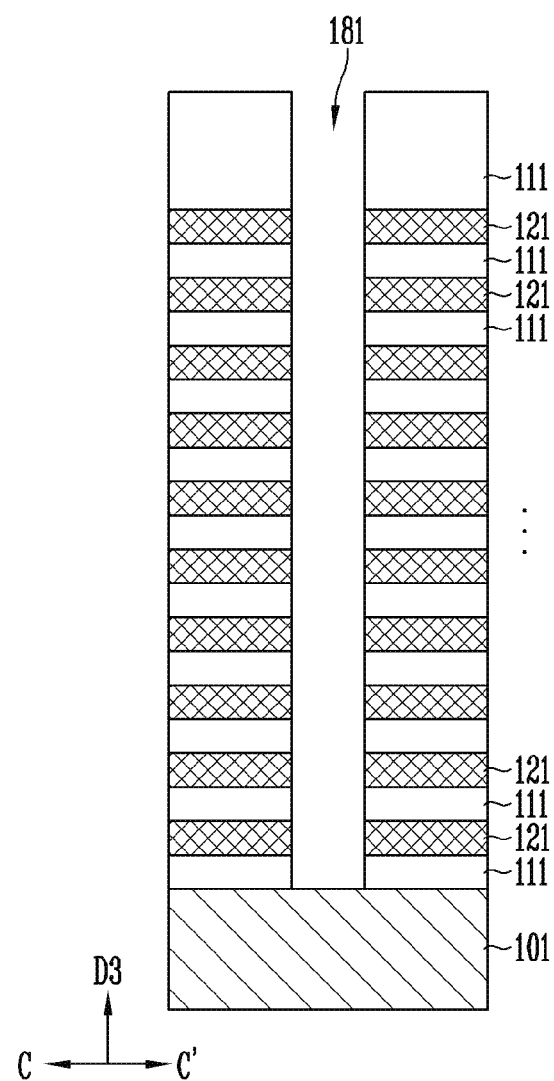
Figure 25:
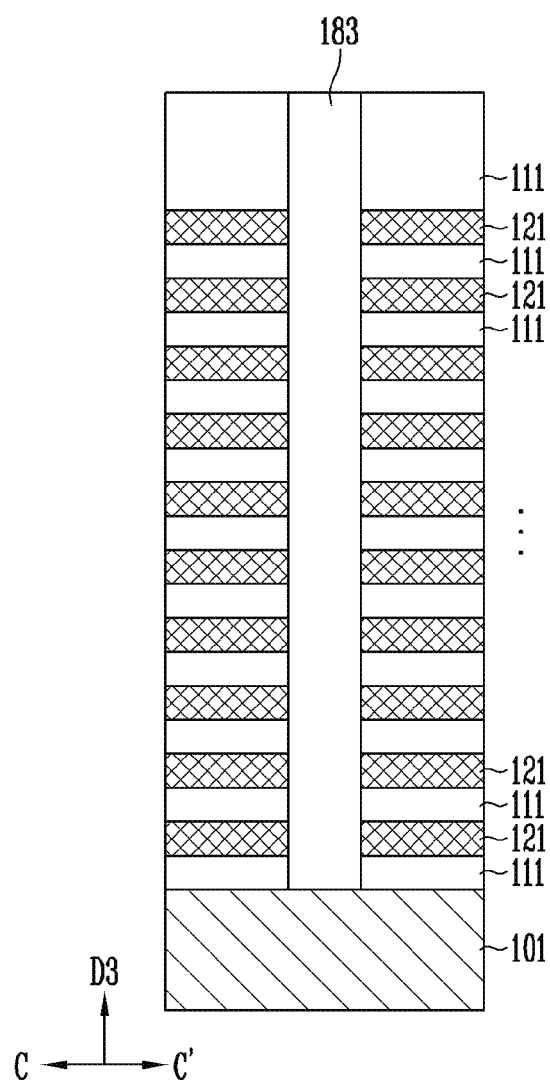

FIGS. 23 to 25 are diagrams illustrating a process of forming a channel separation pattern.

FIG. 23 is a plan view illustrating a channel separation trench 181, and FIG. 24 is a cross-sectional view taken along a line C-C' of FIG. 23.

Referring to FIGS. 23 and 24, each of the cell plugs 161 described above with reference to FIGS. 22A and 22B may be penetrated by the channel separation trench 181.

The channel separation trench 181 may separate the channel structure 151 described above with reference to FIGS. 22A and 22B into a first channel pattern 151a and a second channel pattern 151b, and may separate the memory film 141 described above with reference to FIGS. 22A and 22B into a first memory pattern 141a and a second memory pattern 141b. At this time, each of the gate electrodes 121 may serve as an etch stop film, thereby preventing excessive expansion of the channel separation trench 181.

FIG. 25 illustrates a process of forming an insulating film 183.

Referring to FIG. 25, the channel separation trench 181 shown in FIG. 24 may be filled with the insulating film 183.

Therefore, a channel separation pattern including the channel separation trench 181 and the insulating film 183 may be formed.

According to the embodiments of the present disclosure described above, the conductive patterns or the upper conductive patterns used as the gate electrodes are formed to surround the channel separation pattern. When each of the conductive patterns and the upper conductive patterns is separated into a first pattern and a second pattern by the channel separation pattern, resistances of each of the conductive patterns and the upper conductive patterns may be increased. According to the embodiments of the present disclosure, because the conductive patterns or the upper conductive patterns are formed to surround the channel separation pattern, a resistance increase of each of the conductive patterns or the upper conductive patterns may be reduced.

Figure 26:
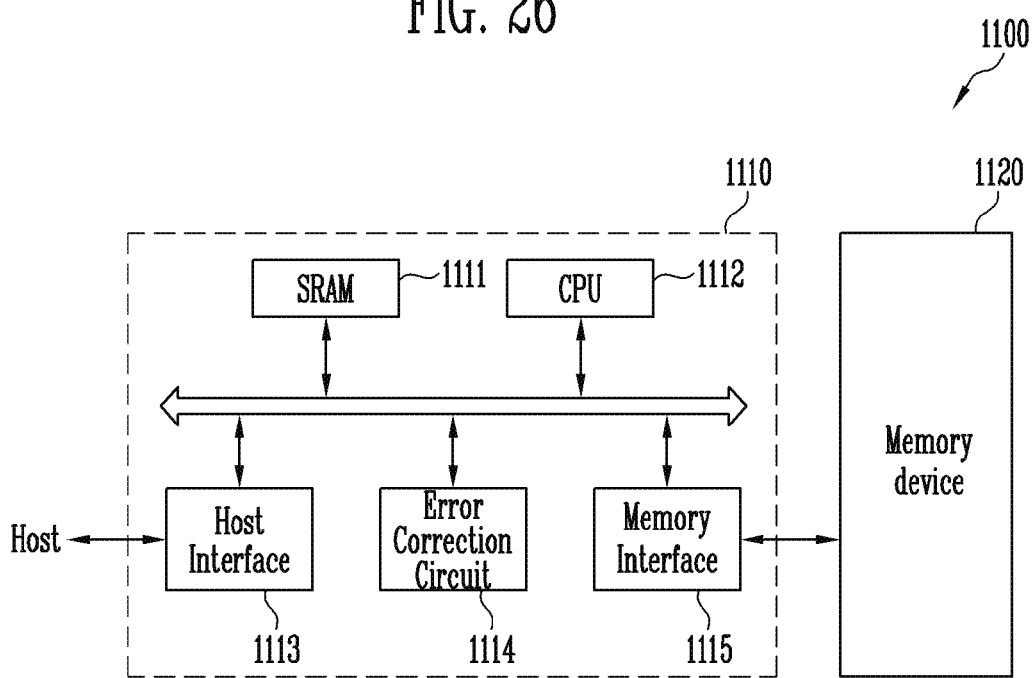
FIG. 26 is a block diagram illustrating a configuration of a memory system according to an embodiment of the present disclosure.

FIG. 26 is a block diagram illustrating a configuration of a memory system 1100 according to an embodiment of the present disclosure.

Referring to FIG. 26, the memory system 1100 according to an embodiment of the present disclosure includes a memory element 1120 and a memory controller 1110.

The memory element 1120 may be a multi-chip package configured of a plurality of flash memory chips. The memory element 1120 may include a gate electrode shared by a first channel pattern and a second channel pattern separated from each other by a channel separation pattern.

The memory controller 1110 is configured to control the memory device 1120 and may include a static random access memory (SRAM) 1111, a central processing unit (CPU) 1112, a host interface 1113, an error correction circuit 1114, and a memory interface 1115. The SRAM 1111 is used as an operation memory of the CPU 1112, the CPU 1112 performs all control operations for data exchange of the memory controller 1110, and the host interface 1113 includes a data exchange protocol of a host connected to the memory system 1100. In addition, the error correction circuit 1114 detects and corrects an error included in data read from the memory element 1120 and the memory interface 1115 performs interfacing with the memory element 1120. In addition, the memory controller 1110 may further include a read only memory (ROM) that stores code data for interfacing with the host.

The memory system 1100 described above may be a memory card or a solid state disk (SSD) with which the memory element 1120 and the memory controller 1110 are combined. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 27:
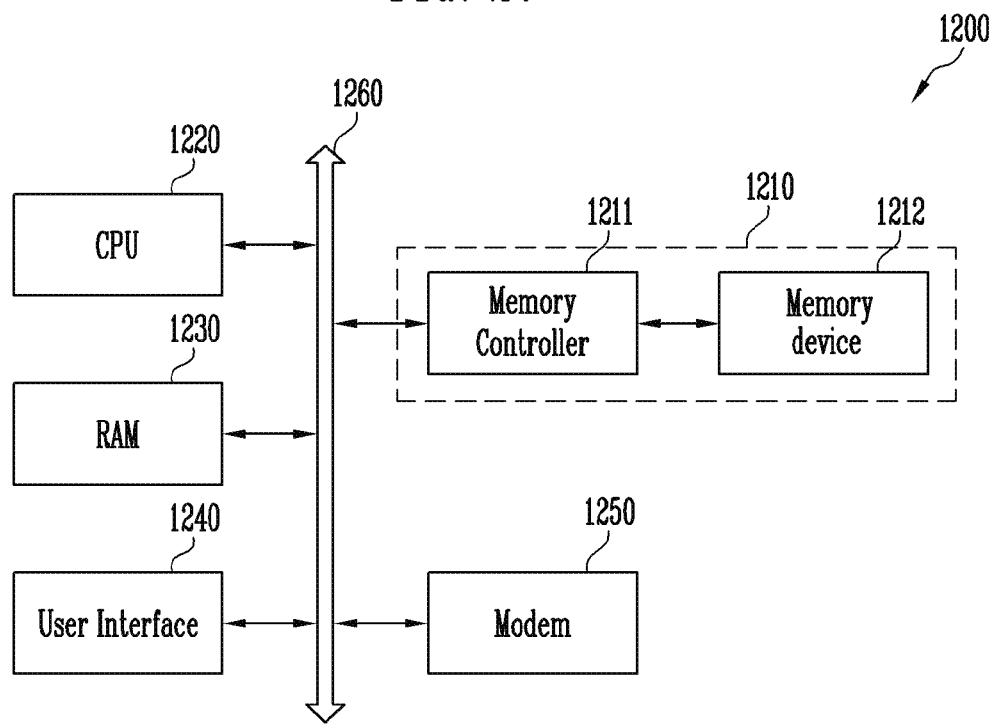
FIG. 27 is a block diagram illustrating a configuration of a computing system according to an embodiment of the present disclosure.

FIG. 27 is a block diagram illustrating a configuration of a computing system 1200 according to an embodiment of the present disclosure.

Referring to FIG. 27, the computing system 1200 according to an embodiment of the present disclosure may include a central processing unit (CPU) 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may be configured of the memory element 1212 and the memory controller 1211.

The present technology may improve a degree of integration of memory cells by separating the first channel pattern and the second channel pattern shared by the conductive pattern from each other.

What is claimed is:

1. A semiconductor memory device comprising:
   a first channel pattern and a second channel pattern each extending in a vertical direction and facing each other;
   a channel separation pattern formed between the first channel pattern and the second channel pattern and extending in the vertical direction;
   a stack including conductive patterns stacked apart from each other in the vertical direction;
   a first memory pattern disposed between each of the conductive patterns and the first channel pattern;
   a second memory pattern disposed between each of the conductive patterns and the second channel pattern; and
   a plurality of bit lines spaced apart from the stack in the vertical direction,
   wherein each of the conductive patterns includes a first portion extending along a sidewall of the first memory pattern, a second portion extending along a sidewall of the second memory pattern, and a third portion connecting the first portion and the second portion, and
   wherein a longest dimension of the channel separation pattern is in an oblique direction with respect to the plurality of bit lines.

2. The semiconductor memory device of claim 1, wherein the plurality of bit lines includes:
   a first bit line spaced apart from the stack in the vertical direction, connected to one end of the first channel pattern, and extending in a first direction not parallel to the vertical direction; and
   a second bit line extending parallel to the first bit line, spaced apart from the first bit line in a second direction not parallel to the first direction, and connected to one end of the second channel pattern.

3. The semiconductor memory device of claim 2, further comprising:
   at least one third bit line disposed between the first bit line and the second bit line and insulated from the first channel pattern and the second channel pattern.

4. The semiconductor memory device of claim 1, further comprising:
   a first upper conductive pattern disposed between the stack and the plurality of bit lines and surrounding a sidewall of the first channel pattern;
   a second upper conductive pattern disposed between the stack and the plurality of bit lines and surrounding a sidewall of the second channel pattern; and
   an upper separation structure disposed between the first upper conductive pattern and the second upper conductive pattern,
   wherein the plurality of bit lines extends in a first direction not parallel to the vertical direction and includes a common bit line commonly connected to one end of the first channel pattern and one end of the second channel pattern, and
   wherein the upper separation structure extends in a second direction not parallel to the first direction.

5. The semiconductor memory device of claim 4,
   wherein the upper separation structure is penetrated by the channel separation pattern,
   wherein the channel separation pattern extends in the second direction, and
   wherein the upper separation structure is wider than the channel separation pattern in the first direction.

6. The semiconductor memory device of claim 1, further comprising:
   a lower select line disposed between the stack and the plurality of bit lines and surrounding the first channel pattern, the channel separation pattern, and the second channel pattern; and
   an upper select line disposed between the lower select line and the plurality of bit lines and surrounding the first channel pattern, the channel separation pattern, and the second channel pattern;
   wherein the plurality of bit lines extends in a first direction not parallel to the vertical direction and includes a common bit line commonly connected to one end of the first channel pattern and one end of the second channel pattern,
   wherein the first channel pattern includes a first channel region facing the lower select line and a second channel region facing the upper select line,
   wherein the second channel pattern includes a third channel region facing the lower select line and a fourth channel region facing the upper select line, and
   wherein threshold voltages of each of the first channel region and the fourth channel region are higher than threshold voltages of each of the second channel region and the third channel region.

7. The semiconductor memory device of claim 1, wherein each of the first channel pattern and the second channel pattern includes a first sidewall facing a sidewall of the channel separation pattern and a second sidewall facing the stack, and
   wherein the second sidewall has a curvature greater than a curvature of the first sidewall.

8. The semiconductor memory device of claim 1, wherein each of the first memory pattern and the second memory pattern includes a tunnel insulating film, a data storage film formed on a sidewall of the tunnel insulating film, and a blocking insulating film formed on the data storage film, and
   wherein at least one of the tunnel insulating film, the data storage film, and the blocking insulating film extends on a sidewall of the channel separation pattern.

9. The semiconductor memory device of claim 1, wherein each of the first memory pattern and the second memory pattern includes a tunnel insulating film, a floating gate film formed on a sidewall of the tunnel insulating film, and a blocking insulating film formed on the floating gate film,
   wherein the tunnel insulating film and the floating gate film are separated into the first memory pattern and the second memory pattern, respectively, by the channel separation pattern, and
   the blocking insulating film extends on a sidewall of the channel separation pattern.

10. The semiconductor memory device of claim 1, wherein the channel separation pattern extends between the first memory pattern and the second memory pattern.

11. A semiconductor memory device comprising:
    a first channel pattern and a second channel pattern each extending in a vertical direction and facing each other;
    a channel separation pattern formed between the first channel pattern and the second channel pattern and extending in the vertical direction;

a stack including conductive patterns stacked apart from each other in the vertical direction;

a first memory pattern disposed between each of the conductive patterns and the first channel pattern;

a second memory pattern disposed between each of the conductive patterns and the second channel pattern;

a first bit line spaced apart from the stack in the vertical direction, connected to one end of the first channel pattern, and extending in a first direction not parallel to the vertical direction; and a second bit line extending parallel to the first bit line, spaced apart from the first bit line in a second direction not parallel to the first direction, and connected to one end of the second channel pattern, wherein each of the conductive patterns includes a first portion extending along a sidewall of the first memory pattern, a second portion extending along a sidewall of the second memory pattern, and a third portion connecting the first portion and the second portion, and wherein a longest dimension of the channel separation pattern is in an oblique direction with respect to the first and second directions.

12. A semiconductor memory device comprising:

a cell gate electrode extending in a first direction and a second direction not parallel to the first direction;

a hole passing through the cell gate electrode;

a first channel pattern formed on a first sidewall of the hole;

a second channel pattern formed on a second sidewall of the hole and spaced apart from the first channel pattern;

a first memory pattern disposed between the cell gate electrode and the first channel pattern;

second memory patterns disposed between the cell gate electrode and the second channel pattern;

a channel separation pattern disposed between the first channel pattern and the second channel pattern; and a plurality of bit lines spaced apart from the cell gate electrode in the vertical direction, wherein the cell gate electrode continuously extends along the first sidewall and the second sidewall of the hole to commonly control the first channel pattern and the second channel pattern, and wherein a longest dimension of the channel separation pattern is in an oblique direction with respect to the plurality of bit lines.

13. The semiconductor memory device of claim 12, wherein the plurality of bit lines includes:

a first bit line connected to one end of the first channel pattern; and a second bit line connected to one end of the second channel pattern and spaced apart from the first bit line.

14. The semiconductor memory device of claim 13, further comprising:

a select gate electrode disposed between the cell gate electrode and the first bit line and extending to overlap the second bit line;

wherein the first channel pattern and the second channel pattern extend to pass through the select gate electrode, and wherein the select gate electrode is shared by the first channel pattern and the second channel pattern.

15. The semiconductor memory device of claim 12, further comprising:

a first select gate electrode disposed between the cell gate electrode and the plurality of bit lines;

a second select gate electrode disposed between the cell gate electrode and the plurality of bit lines and parallel to the first select gate electrode; and an upper separation structure disposed between the first select gate electrode and the second select gate electrode and overlapping the cell gate electrode;

wherein the plurality of bit lines includes a common bit line commonly connected to one end of the first channel pattern and one end of the second channel pattern, wherein the first channel pattern extends to pass through the first select gate electrode, and wherein the second channel pattern extends to pass through the second select gate electrode.

16. The semiconductor memory device of claim 12, further comprising:

a lower select gate electrode disposed between the cell gate electrode and the plurality of bit lines; and an upper select gate electrode disposed between the lower select gate electrode and the plurality of bit lines;

wherein the first and second channel patterns extend to pass through the lower select gate electrode and the upper select gate electrode, respectively, wherein the plurality of bit lines includes a common bit line commonly connected to one end of the first channel pattern and one end of the second channel pattern;

wherein the first channel pattern includes a first channel region facing the lower select gate electrode and a second channel region facing the upper select gate electrode, wherein the second channel pattern includes a third channel region facing the lower select gate electrode and a fourth channel region facing the upper select gate electrode, and wherein threshold voltages of each of the first channel region and the fourth channel region are higher than threshold voltages of each of the second channel region and the third channel region.

17. The semiconductor memory device of claim 12, wherein the channel separation pattern is surrounded by the cell gate electrode.

18. The semiconductor memory device of claim 17, wherein the channel separation pattern extends between the first memory pattern and the second memory pattern.

19. The semiconductor memory device of claim 17, wherein the first memory pattern and the second memory pattern extend on a sidewall of the channel separation pattern to be connected to each other.

* * * * *